United States Patent
Yun et al.

(10) Patent No.: US 9,455,206 B2
(45) Date of Patent: Sep. 27, 2016

(54) OVERLAY MEASURING METHOD AND SYSTEM, AND METHOD OF MANUFACTURING SEMICONDUCTOR DEVICE USING THE SAME

(71) Applicants: Seong-Jin Yun, Yongin-si (KR); Woo-Seok Ko, Seoul (KR); Yu-Sin Yang, Seoul (KR); Sang-Kil Lee, Yongin-si (KR); Chung-Sam Jun, Suwon-si (KR)

(72) Inventors: Seong-Jin Yun, Yongin-si (KR); Woo-Seok Ko, Seoul (KR); Yu-Sin Yang, Seoul (KR); Sang-Kil Lee, Yongin-si (KR); Chung-Sam Jun, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/796,478

(22) Filed: Jul. 10, 2015

(65) Prior Publication Data

US 2016/0013109 A1    Jan. 14, 2016

(30) Foreign Application Priority Data

Jul. 11, 2014    (KR) .................. 10-2014-0087505

(51) Int. Cl.
*H01L 21/66* (2006.01)
*H01J 37/22* (2006.01)

(52) U.S. Cl.
CPC .............. *H01L 22/20* (2013.01); *H01J 37/222* (2013.01); *H01J 2237/221* (2013.01); *H01J 2237/2617* (2013.01); *H01J 2237/2817* (2013.01)

(58) Field of Classification Search
CPC .................................................. H01L 21/0332
USPC ................................................. 438/308, 949
See application file for complete search history.

(56) References Cited

U.S. PATENT DOCUMENTS

| 7,282,422 B2 * | 10/2007 | Baek ..................... H01L 23/544 438/401 |
| 7,991,218 B2 | 8/2011 | Toyoda et al. |
| 8,041,104 B2 | 10/2011 | Toyoda et al. |
| 8,148,682 B2 | 4/2012 | Hotta et al. |
| 8,229,205 B2 | 7/2012 | Hyon et al. |
| 8,559,001 B2 * | 10/2013 | Chang ..................... H01L 22/12 438/16 |
| 8,577,124 B2 | 11/2013 | Toyoda et al. |
| 8,642,957 B2 | 2/2014 | Miyamoto et al. |
| 2013/0293890 A1 | 11/2013 | Amir et al. |
| 2014/0065736 A1 | 3/2014 | Amir et al. |

FOREIGN PATENT DOCUMENTS

| JP | 4154374 B | 7/2008 |
| JP | 4585926 B | 9/2010 |
| JP | 2011-099864 A | 5/2011 |

(Continued)

*Primary Examiner* — Chandra Chaudhari
(74) *Attorney, Agent, or Firm* — Lee & Morse, P.C.

(57) ABSTRACT

An overlay measuring method includes irradiating an electron beam onto a sample, including a multi-layered structure of overlapped upper and lower patterns formed thereon, to obtain an actual image of the upper and lower patterns. A first image representing the upper pattern and a second image representing the lower pattern are obtained from the actual image. A reference position for the upper and lower patterns is determined from a design image of the upper and lower patterns. A position deviation of the upper pattern with respect to the reference position in the first image and a position deviation of the lower pattern with respect to the reference position in the second image are calculated to determine an overlay between the upper pattern and the lower pattern.

10 Claims, 44 Drawing Sheets

(56) References Cited

FOREIGN PATENT DOCUMENTS

| JP | 5173959 B | 1/2013 |
| JP | 2013-168595 A | 8/2013 |
| KR | 2013-0090421 A | 8/2013 |
| KR | 1344107 B | 12/2013 |

\* cited by examiner

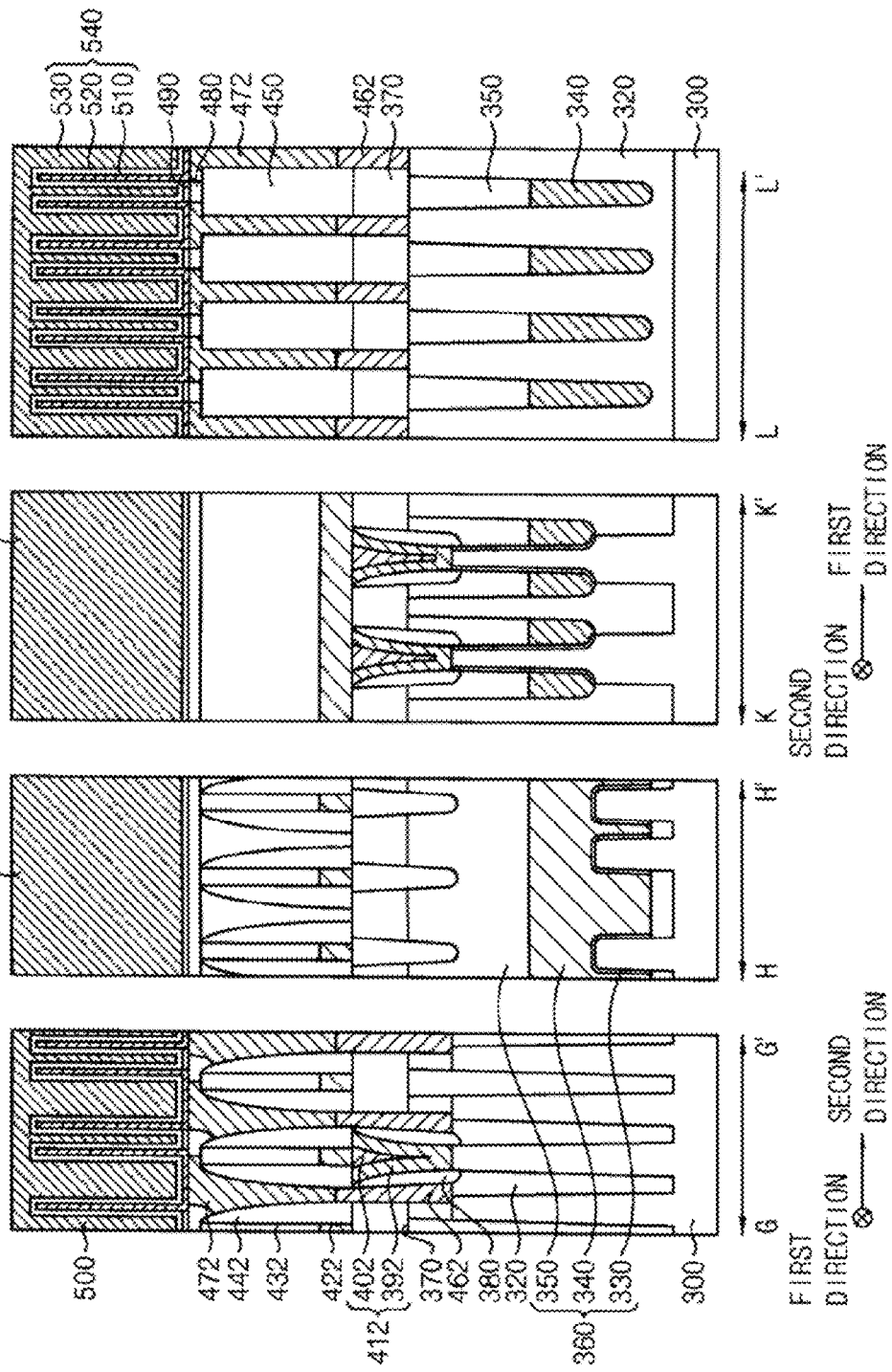

OVERLAY MEASURING METHOD AND SYSTEM, AND METHOD OF MANUFACTURING SEMICONDUCTOR DEVICE USING THE SAME

CROSS-REFERENCE TO RELATED APPLICATION

Korean Patent Application No. 10-2014-0087505, filed on Jul. 11, 2014, in the Korean Intellectual Property Office, and entitled: "Overlay Measuring Method and System, and Method of Manufacturing Semiconductor Device Using the Same," is incorporated by reference herein in its entirety.

BACKGROUND

1. Field

Example embodiments relate to an overlay measuring method and system, and a method of manufacturing a semiconductor device using the same.

2. Description of the Related Art

A reduction in a design rule may cause a photo overlay margin to be reduced. Thus, an overlay measuring technology for evaluating overlay between upper and lower patterns may become more important.

SUMMARY

According to example embodiments, in an overlay measuring method, an electron beam is irradiated onto a sample including a multi-layered structure of overlapped upper and lower patterns formed thereon, to obtain an actual image of the upper and lower patterns. A first image representing the upper pattern and a second image representing the lower pattern are obtained from the actual image. A reference position for the upper and lower patterns is determined from a design image of the upper and lower patterns. A position deviation of the upper pattern with respect to the reference position in the first image and a position deviation of the lower pattern with respect to the reference position in the second image are calculated to determine an overlay between the upper pattern and the lower pattern.

In example embodiments, irradiating the electron beam may include irradiating a high voltage electron beam having an acceleration voltage of at least 10 kV.

In example embodiments, obtaining the actual image may include detecting secondary electrons emitting from an upper layer in which the upper pattern is formed and detecting backscattered electrons emitting from a lower layer in which the lower pattern is formed.

In example embodiments, the upper pattern may include a contact hole.

In example embodiments, the upper pattern may have an aspect ratio of at least 1:5.

In example embodiments, obtaining the first image and the second image from the actual image may include dividing the actual image according to a gray level distribution into the first image and the second image.

In example embodiments, determining the reference position for the upper and lower patterns from the design image may include determining a lattice point corresponding to each of the upper and lower patterns from the design image.

In example embodiments, the lattice point may be a common lattice which is determined from the design image of any one of the upper and lower patterns.

In example embodiments, the position deviation of the upper pattern may be a relative position of the upper pattern with respect to the corresponding lattice point and the position deviation of the lower pattern may be a relative position of the lower pattern with respect to the corresponding lattice point.

In example embodiments, calculating the position deviation of the upper pattern and the position deviation of the lower pattern may include sorting the upper patterns in a same layer or the lower patterns in a same layer into at least two first and second groups of patterns, and calculating position deviations of the first and second groups of the patterns to determine an overlay between the first and second groups of the patterns.

According to example embodiments, in a method of manufacturing a semiconductor device, a multi-layered structure of an upper pattern and a lower pattern is prepared, the lower pattern being formed by a first semiconductor process, the upper pattern being formed by a second semiconductor process. An electron beam is irradiated onto the multi-layered structure to obtain an actual image of the upper and lower patterns. A first image representing the upper pattern and a second image representing the lower pattern are obtained from the actual image. Each of the first and second images and a design image of the first and second patterns are matched to determine an overlay between the upper pattern and the lower pattern. At least one of the first and second semiconductor processes is compensated based on the overlay measurement.

In example embodiments, obtaining the actual image may include detecting secondary electrons emitting from an upper layer in which the upper pattern is formed and detecting backscattered electrons emitting from a lower layer in which the lower pattern is formed.

In example embodiments, obtaining the first image and the second image from the actual image may include dividing the actual image according to a gray level distribution into the first image and the second image.

In example embodiments, matching each of the first and second images and the design image may include calculating a position center for the upper pattern in the first image, calculating a position center for the lower pattern in the second image, determining a reference position for the upper and lower patterns from the design image, and calculating a position deviation of the upper pattern with respect to the reference position in the first image and a position deviation of the lower pattern with respect to the reference position in the second image.

In example embodiments, determining the reference position for the upper and lower patterns from the design image may include determining a lattice point corresponding to each of the upper and lower patterns from the design image.

In example embodiments, the lattice point may be a common lattice which is determined from the design image of any one of the upper and lower patterns.

In example embodiments, the position deviation of the upper pattern may be a relative position of the upper pattern with respect to the corresponding lattice point and the position deviation of the lower pattern may be a relative position of the lower pattern with respect to the corresponding lattice point.

In example embodiments, calculating the position deviation of the upper pattern and the position deviation of the lower pattern may include sorting the upper patterns in a same layer or the lower patterns in a same layer into at least two first and second groups of patterns, and calculating position deviations of the first and second groups of the patterns to determine an overlay between the first and second groups of the patterns.

In example embodiments, the upper and lower patterns may include one-dimensional or two-dimensional structure.

In example embodiments, compensating the at least one of the first and second semiconductor processes may include, when any one of the processes is determined to be in an abnormal process state, compensating a process parameter of the process.

According to example embodiments, an overlay measuring system includes an electron microscope irradiating an electron beam onto a multi-layered structure having an upper layer and a lower layer to and detect electrons emitting from the multi-layered structure and including an electron gun generating the electron beam, an acceleration voltage of the electron beam capable of being adjusted to control a depth to which the electron beam penetrates into the multi-layered structure, an image acquisition portion connected to the electron microscope to obtain an actual image from the detected electrons and obtaining a first image representing the upper layer and a second image representing the lower layer from the actual image, and an image processing portion comparing each of the first and second images and a design image of the patterns and calculating an overlay between an upper pattern and a lower pattern.

In example embodiments, the electron gun may irradiate a high voltage electron beam having an acceleration voltage of at least 10 kV.

In example embodiments, the electron microscope may include a first detector detecting secondary electrons emitting from the upper layer and a second detector detecting backscattered electrons emitting from the lower layer.

In example embodiments, the image acquisition portion may divide the actual image according to a gray level distribution into the first image and the second image.

In example embodiments, the image processing portion may include a pattern position calculation portion calculating representative positions of the upper and lower patterns from the first and second images, a reference position determination portion determining a reference position for the upper and lower patterns from the design image, and a matching portion calculating a position deviation of the upper pattern with respect to the reference position and a position deviation of the lower pattern with respect to the reference position.

In example embodiments, the reference position determination portion may determine a lattice point corresponding to each of the upper and lower patterns as the reference position from the design image.

In example embodiments, the lattice point may be a common lattice which is determined from the design image of any one of the upper and lower patterns.

In example embodiments, the position deviation of the upper pattern may be a relative position of the upper pattern with respect to the corresponding lattice point and the position deviation of the lower pattern may be a relative position of the lower pattern with respect to the corresponding lattice point In example embodiments, the design image may include a graphic data system (GDS) image.

According to example embodiments, a high voltage electron beam may be irradiated onto a multi-layered structure in a cell region of a semiconductor device to obtain an actual image representing an upper pattern as well as a lower pattern, and then, the actual image may be divided into first and second images representing the upper pattern and the lower pattern respectively. A lattice point may be determined as a reference position from a design image of the upper pattern and the lower pattern, and then, a position deviation of the upper pattern with respect to the reference position in the first image and a position deviation of the lower pattern with respect to the reference position in the second image may be calculated to precisely measure an overlay between the upper pattern and the lower pattern.

Embodiments are also directed to a method of manufacturing a semiconductor device, the method including providing a first substrate, forming a first lower pattern on the first substrate using a first process, forming a first upper pattern directly above the first lower pattern using a second process, imaging a region of overlap of the first upper and lower patterns to obtain a single scanning electron micrograph (SEM) image, the SEM image showing aspects of at least a portion of the first upper pattern and at least a portion of the first lower pattern, extracting first image data corresponding to the first lower pattern from the SEM image, extracting second image data corresponding to the first upper pattern from the SEM image, and determining a first relative overlay of the first lower pattern relative to the first upper pattern, determining the first relative overlay including comparing the first image data and second image data to design data, the design data representing a design overlay of the first lower pattern and the first upper pattern.

The method may further include adjusting one or more process variables of one or both of the first and second processes based on the first relative overlay.

The method may further include providing a second substrate, forming a second lower pattern on the second substrate using the first process, and forming a second upper pattern directly above the second lower pattern on the second substrate using the second process.

The first process may be adjusted based on the one or more adjusted process variables prior to forming the second lower pattern on the second substrate, adjusting the first process producing a second relative overlay for the second substrate that is different from the first relative overlay for the first substrate.

The second process may be adjusted based on the one or more adjusted process variables prior to forming the second upper pattern on the second substrate, adjusting the second process producing a second relative overlay for the second substrate that is different from the first relative overlay for the first substrate.

BRIEF DESCRIPTION OF THE DRAWINGS

Features will become apparent to those of skill in the art by describing in detail exemplary embodiments with reference to the attached drawings in which:

FIGS. 14, 16, 18, 23, 25, 29, 31, 33, 38 and 42 illustrate cross-sectional views illustrating stages of a method of manufacturing the semiconductor device in accordance with example embodiments.

DETAILED DESCRIPTION

Figure 1:
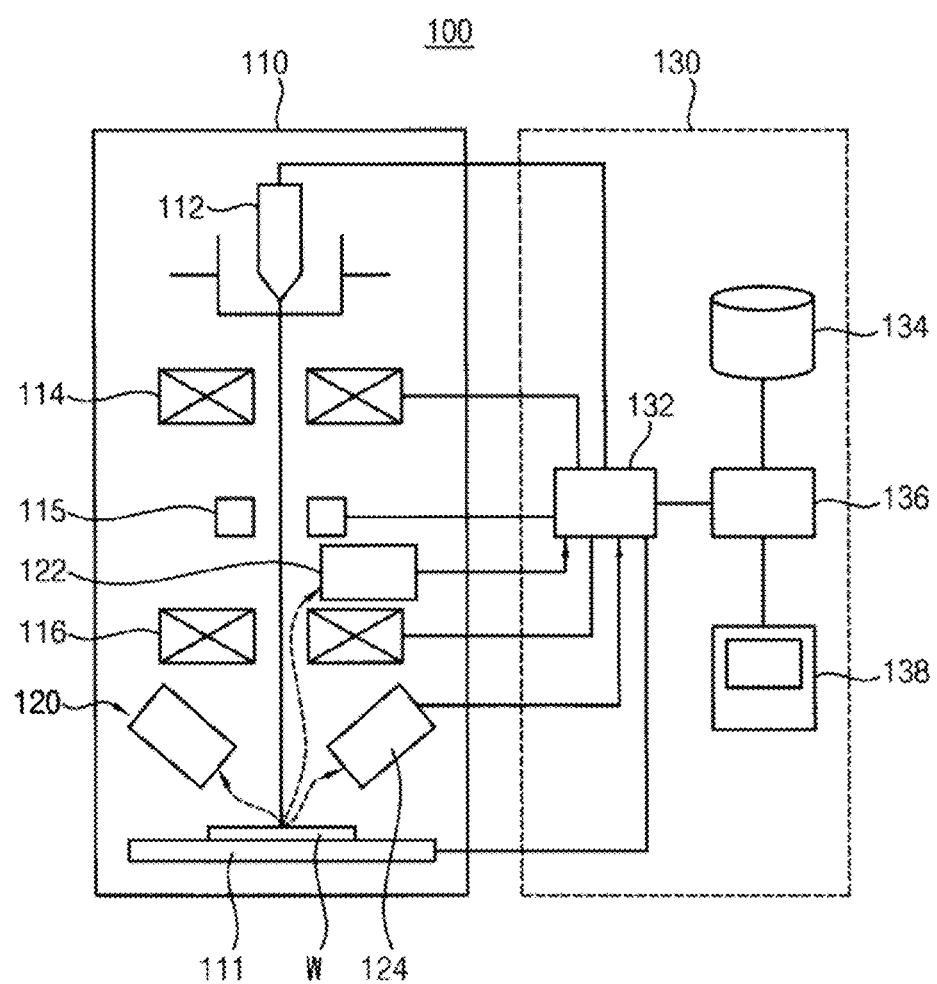
FIG. 1 illustrates a block diagram illustrating an overlay measuring system in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
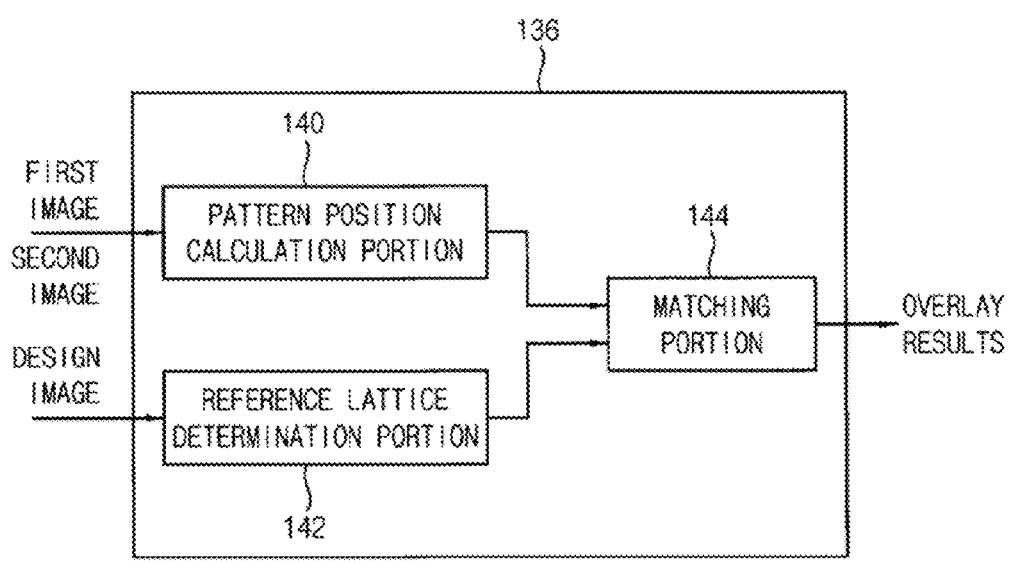
FIG. 2 illustrates a block diagram illustrating an image processing portion in FIG. 1.

FIG. 1 is a block diagram illustrating an overlay measuring system in accordance with example embodiments. FIG. 2 is a block diagram illustrating an image processing portion in FIG. 1.

Referring to FIGS. 1 and 2, an overlay measuring system 100 may include an electron microscope 110 irradiating an electron beam onto a sample (such as semiconductor wafer having a multi-layered structure formed thereon) and detecting electrons emitting from the sample, and a processor 130 obtaining and analyzing an image from the electrons detected by the electron microscope 110 and calculating an overlay between an upper layer and a lower layer of the multi-layered structure.

In example embodiments, the overlay measuring system may be used to measure an overlay between a previously patterned first layer and a currently patterned second layer on the first layer in a nondestructive manner in a semiconductor manufacturing process for manufacturing semiconductor devices such as DRAM, VNAND, etc.

As illustrated in FIG. 1, the electron microscope 110 of the overlay measuring system 100 may include scanning electron microscope (SEM). The scanning electron microscope may be high voltage scanning electron microscope. The scanning electron microscope may include a microscope stage 111 for supporting a sample W, an electron gun 112 for generating primary electron beam, an electron beam column having focusing lenses 114, a deflector 115 and an object lens 116 for controlling a direction and a width of the primary electron beam and irradiating the electron beam onto the sample W, and a detector 120 for detecting electrons emitting from the sample W.

For example, the sample W may be a semiconductor wafer including a multi-layered structure formed thereon. The sample W may include a multi-layered structure of upper and lower patterns which are overlapped with each other. The wafer may refer to a substrate formed of a semiconductor or non-semiconductor material. The wafer may include one or more layers formed on the substrate. For example, such layers may include a resist, a dielectric material, a conductive material, etc.

In example embodiments, an acceleration voltage of the electron beam generated by the electron gun 112 may be adjusted into high voltage or low voltage to control a depth to which the electron beam penetrates into the sample W. For example, the electron gun 112 may generate an electron beam having an acceleration voltage of about 10 kV or more. As the acceleration voltage of the electron beam is increased, the penetration depth of the electron beam may be increased, and thus, an amount of electrons emitting from an underlying layer may be increased to detect electrons having information about the underlying structure.

Accordingly, when the electron beam having high landing energy of about 10 kV or more is irradiated onto the sample W, secondary electrons, backscattered electrons, and auger electrons may be emitted from the sample W.

The electron microscope 110 may include the detector 120 for detecting the electrons emitting from the sample W. The detector 120 may include a first detector 122 mainly detecting the secondary electrons and a second detector 124 mainly detecting the backscattered electrons. For example, the first detector 122 may include an in-lens detector for detecting secondary electrons having information about an upper structure. The second detector 124 may include a detector which is arranged adjacent to the objective lens 116 to mainly detect the backscattered electrons having information about a lower structure. The detected electrons may be used to generate an actual image of the sample W, as described further below.

Thus, high voltage electron beam may be used to detect secondary electrons as well as backscattered electrons, to thereby obtain a SEM image representing upper and lower structures. That is, the actual image may represent the upper structure and the lower structure of the multi-layered structure. For example, high voltage electron beam may be used to obtain an actual image representing a hole pattern such as a high aspect ratio contact hole and a lower structure under the hole pattern.

The overlay measuring system 100 may include an image acquisition portion 132 which receives a detection signal from the detector 120 to obtain an image. The image acquisition portion 132 may receive detection signals from the first and second detectors 122, 124 to obtain a SEM image representing upper and lower structures of the sample W. The image acquisition portion 132 may be operatively connected to and control various components such as the electron gun 112, the focusing lenses 114, the deflector 115, the objective lens 116 and the microscope stage 111 of the electron microscope 110.

The image acquisition portion 132 may control the electron microscope 110 to obtain information about the upper and lower structures of the sample W. For example, the image acquisition portion 132 may control the acceleration voltage (high voltage, low voltage) of the electron gun 112, the electron microscope may irradiate the electron beam having the controlled acceleration voltage onto the multi-layered structure of the sample W at a desired depth, to thereby detect electrons representing structural information of each layer of the sample (W). The image acquisition portion 132 may obtain a SEM image from the detected electrons.

In example embodiments, the image acquisition portion 132 may divide the SEM image into sub-images which represent different layers respectively. For example, a desired gray level range of the SEM image may be selected to divide the SEM image into a first image representing an upper layer and a second image representing a lower layer. The gray level range may be determined in consideration of thicknesses and materials of the upper layer and the lower layer, an amount of the detected electrons, etc. Additionally, the SEM image, the first image and the second image may be stored in a data storage portion 134.

The overlay measuring system 100 may include an image processing portion 136, which compares each of the first and second images and a design image of the patterns to calculate an overlay between the upper pattern and the lower pattern.

As illustrated in FIG. 2, in example embodiments, the image processing portion 136 may include a pattern position calculation portion 140 calculating representative positions of the upper and lower patterns from the first and second images, a reference position determination portion 142 determining a reference position for the upper and lower patterns from the design image, and a matching portion 144 calculating a position deviation of the pattern with respect to the reference position.

In particular, the pattern position calculation portion 140 may receive the first and second images from the data storage portion 134. Alternatively, the pattern position calculation portion 140 may receive the first and second images from the image acquisition portion 132.

The pattern position calculation portion 140 may calculate the representative position of the upper pattern in the first image and the representative position of the lower pattern in the second image. For example, the pattern position calculation portion 140 may calculate a position center for the upper pattern in the first image and calculate a position center for the lower pattern in the second image.

The reference position determination portion 142 may receive a design image for the upper pattern formed in the upper layer and a design image for the lower pattern formed in the lower layer of the sample W. Each design image may be a data image for determining a layout of a pattern. For example, the design image may include a graphic data system (GDS) image as a storage format of layout.

The reference position determination portion 142 may determine a reference position for the upper and lower patterns from the design image. For example, the reference position determination portion 142 may determine a lattice point corresponding to each of the upper and lower patterns from the design image. The lattice point may be a common lattice for the upper and lower patterns.

The matching portion 144 may match the first image and the design image corresponding to the first image, and match the second image and the design image corresponding to the second image, to calculate a position deviation of the upper pattern with respect to the reference position in the first image and a position deviation of the lower pattern with respect to the reference position in the second image. For example, the first and second images and the design image may be matched by an image edge matching method or an image contrast matching method.

In example embodiments, the position deviation of the upper pattern may be a relative position of the upper pattern with respect to the corresponding lattice point and the position deviation of the lower pattern may be a relative position of the lower pattern with respect to the corresponding lattice point.

The matching portion 144 may compare the position deviation of the upper pattern and the position deviation of the lower pattern to calculate the overlay between the upper pattern and the lower pattern.

The image processing portion 136 may be operatively connected to an output portion 138. The overlay result values and images may be transmitted to the output portion 138. The output portion 138 may display the overlay result values on a display device.

One or more of the image acquisition portion 132, the image processing portion 136, the data storage portion 134 and the output portion 138 illustrated in FIG. 1 may be embodied as a single computer or processor 130, or as separate modules operatively connected together, such as independent computers or processors connected together using data transmission or interfacing means. The image acquisition portion 132, the image processing portion 136 and the output portion 138 may also be combined with one or more other modules, for example, as part of quality control processors or controllers in a semiconductor manufacturing line.

Hereinafter, a method of measuring an overlay between an upper pattern and a lower pattern of a multi-layered structure formed on a wafer using the overlay measuring system and a method of manufacturing a semiconductor device using the same will be explained.

Figure 3:
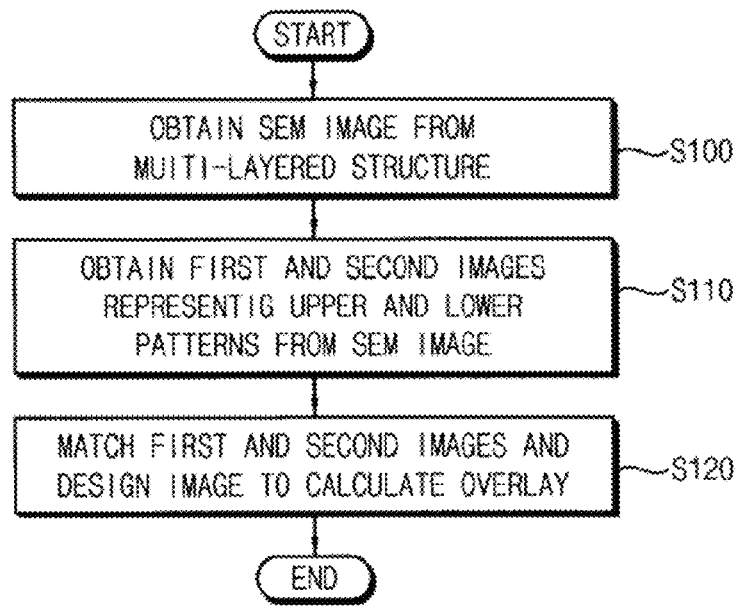
FIG. 3 illustrates a flowchart illustrating an overlay measuring method in accordance with example embodiments.
Figure 4:
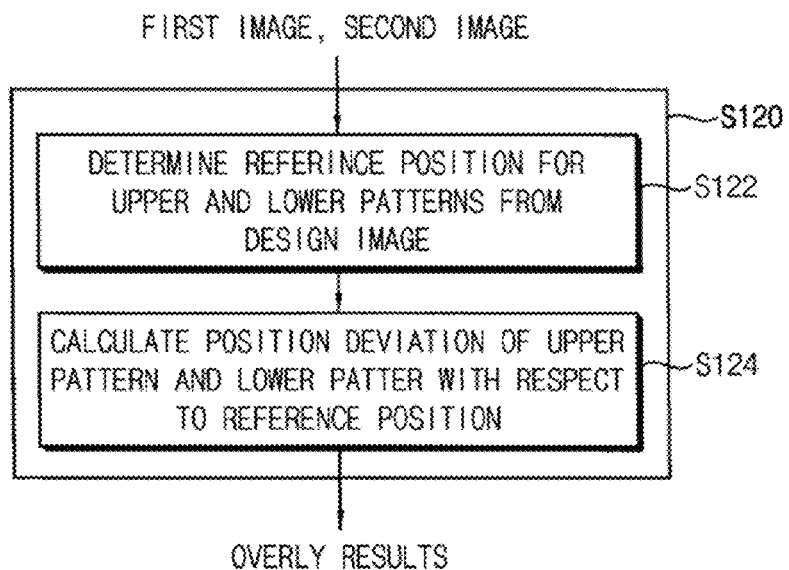
FIG. 4 illustrates a flowchart illustrating an overlay calculating stage in FIG. 3.
Figure 5:
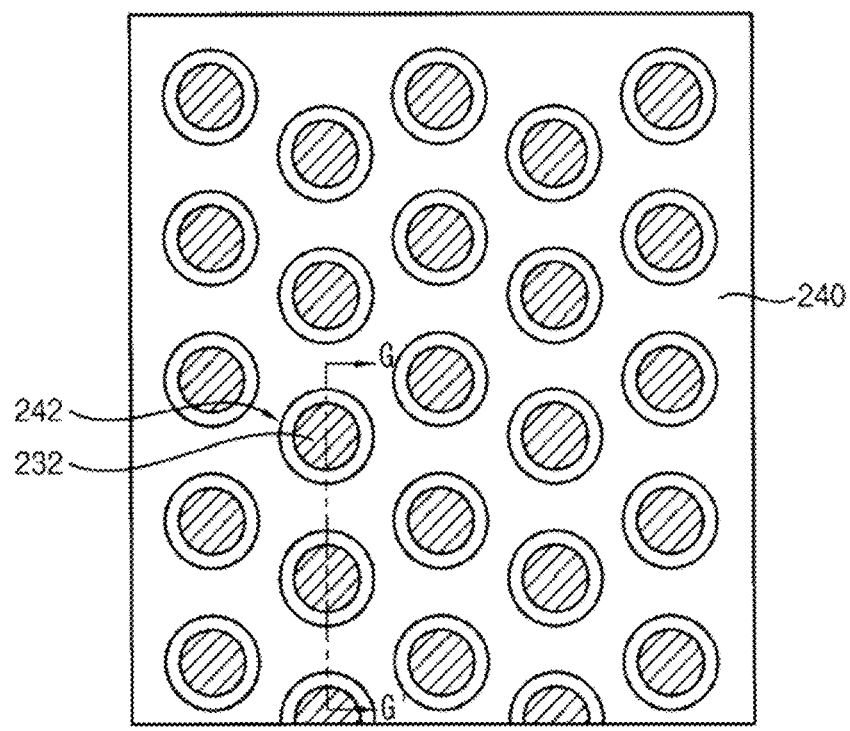
FIG. 5 illustrates a plan view illustrating a multi-layered structure having an upper pattern and a lower pattern formed on a wafer in accordance with example embodiments.
Figure 6:
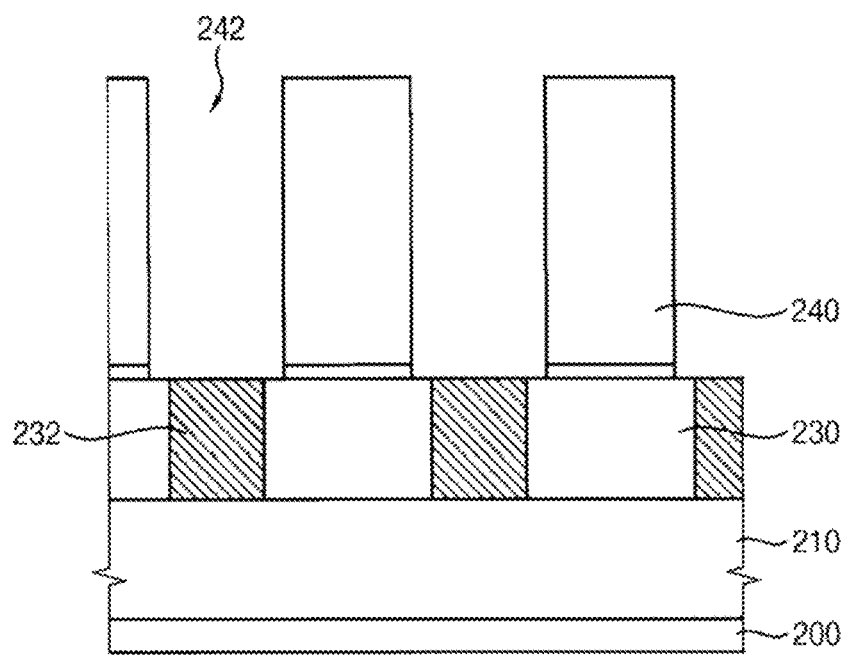
FIG. 6 illustrates a cross-sectional view taken a line G-G' in FIG. 5.
Figure 7:
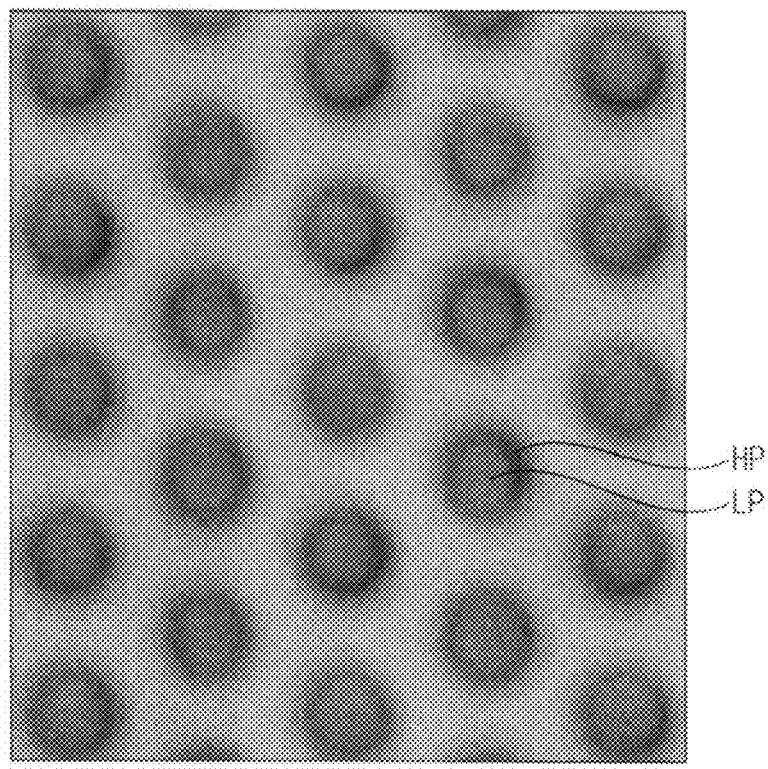
FIG. 7 illustrates a SEM image of the multi-layered structure in FIG. 5.
Figure 8A:
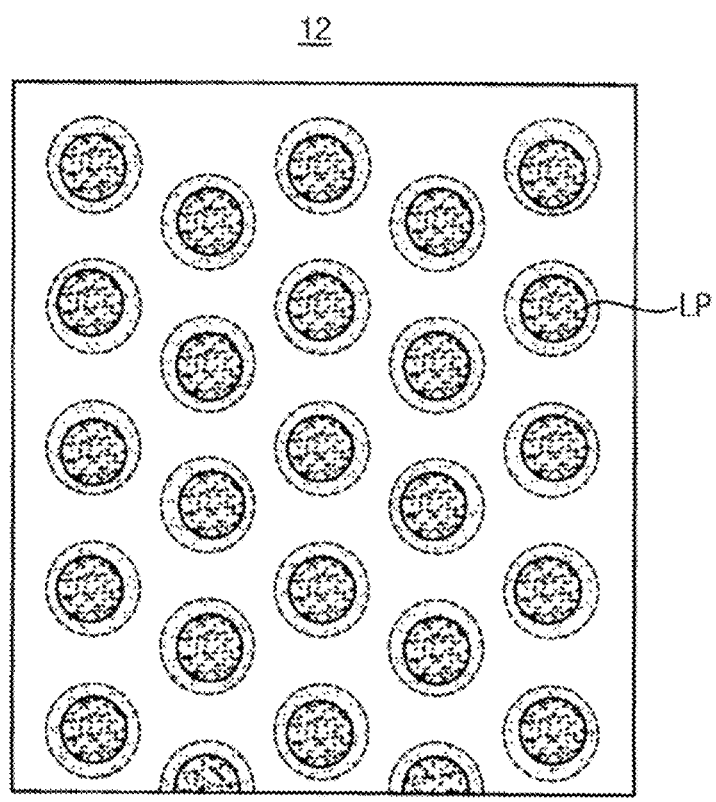
FIGS. 8A and 8B illustrate a first image and a second image divided from the SEM image in FIG. 7.
Figure 8B:
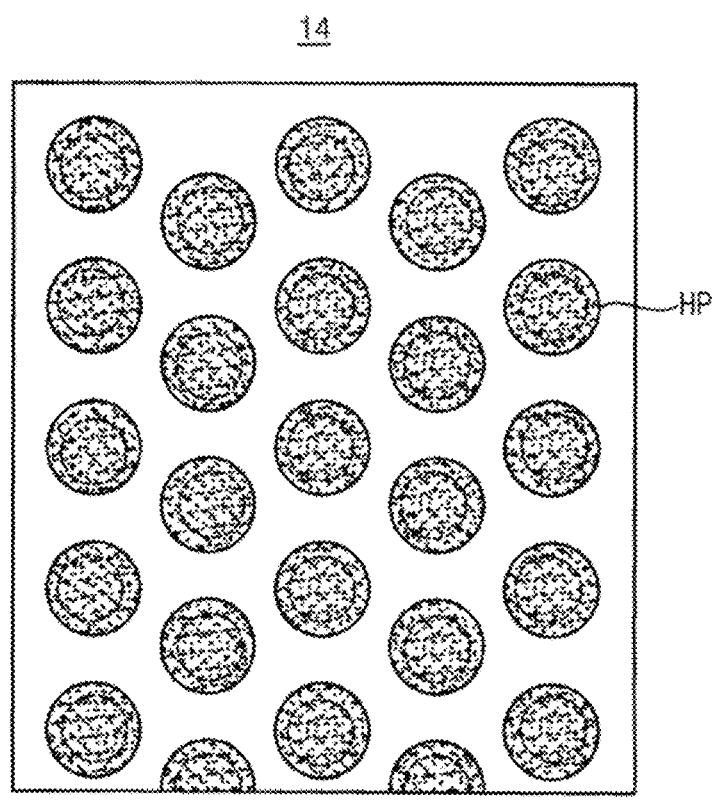
Figure 9:
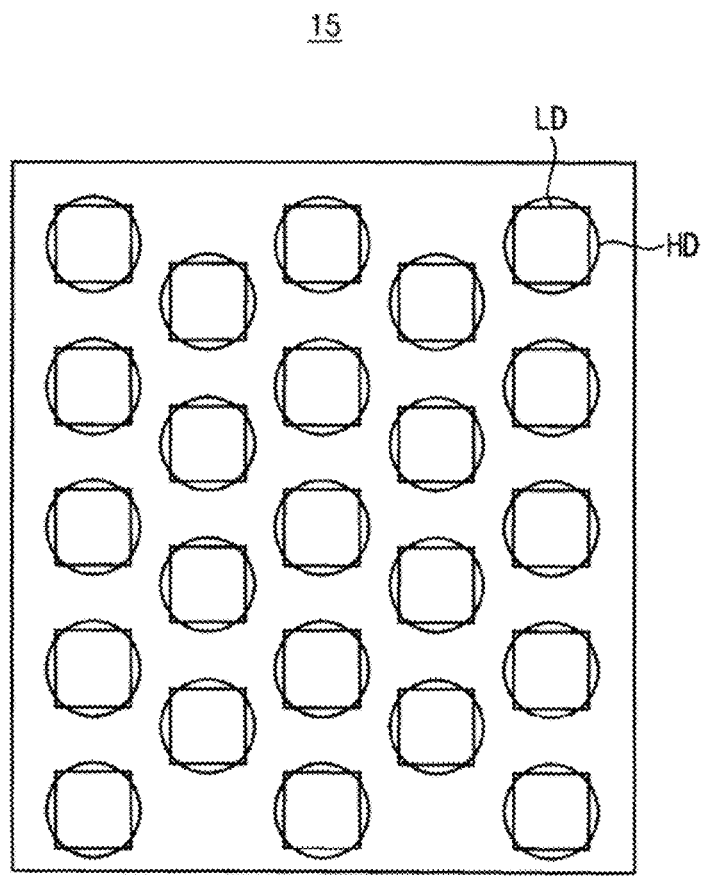
FIG. 9 illustrates a design image for the upper pattern and the lower pattern in FIG. 5.
Figure 10A:
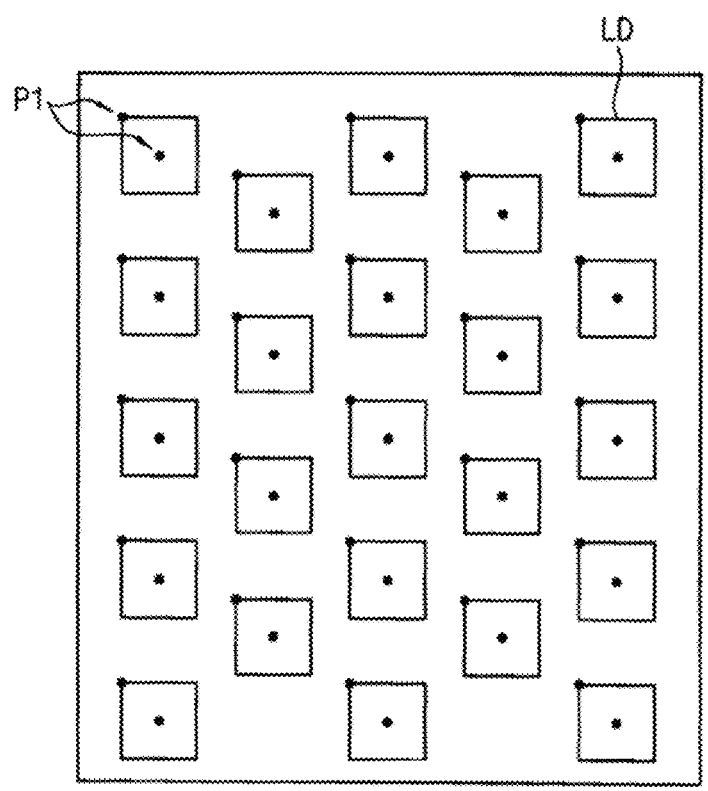
FIG. 10A illustrates a design image for the lower pattern in FIG. 9.
Figure 10B:
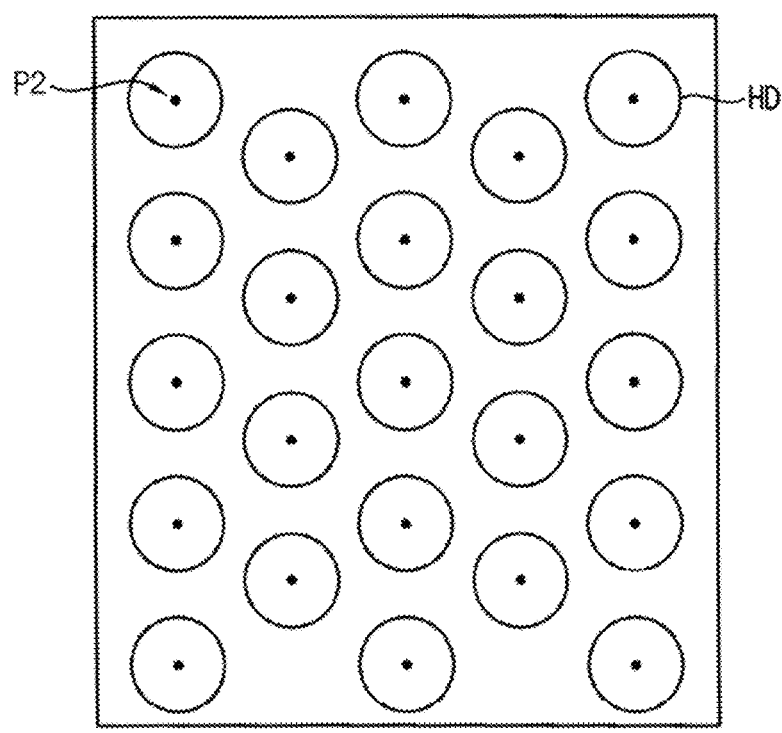
FIG. 10B illustrates a design image for the upper pattern in FIG. 9.
Figure 11:
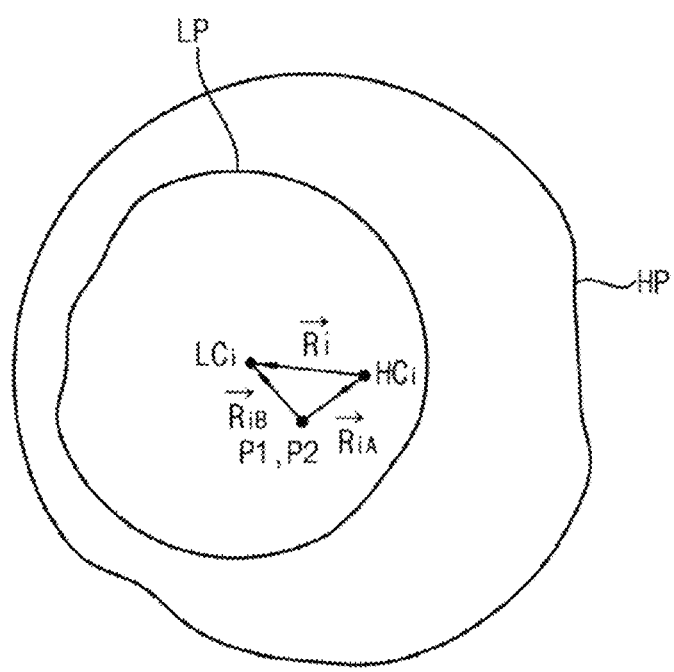
FIG. 11 illustrates a view illustrating an overlay between the overlapped upper and lower patterns with respect to a lattice point of FIGS. 10A and 10B.

FIG. 3 is a flowchart illustrating an overlay measuring method in accordance with example embodiments. FIG. 4 is a flowchart illustrating an overlay calculating stage in FIG. 3. FIG. 5 is a plan view illustrating a multi-layered structure having an upper pattern and a lower pattern formed on a wafer in accordance with example embodiments. FIG. 6 is a cross-sectional view taken a line G-G' in FIG. 5. FIG. 7 is a SEM image of the multi-layered structure in FIG. 5. FIGS. 8A and 8B are a first image and a second image divided from the SEM image in FIG. 7. FIG. 9 is a design image for the upper pattern and the lower pattern in FIG. 5. FIG. 10A is a design image for the lower pattern in FIG. 9. FIG. 10B is a design image for the upper pattern in FIG. 9. FIG. 11 is a view illustrating an overlay between the overlapped upper and lower patterns with respect to a lattice point of FIGS. 10A and 10B.

Referring to FIGS. 1 to 7, an electron beam may be irradiated on a multi-layered structure including an upper layer and a lower layer, each having at least one pattern formed therein, to obtain an actual image of the upper and lower layers (S100).

First, a sample of the multi-layered structure including the upper layer and the lower layer may be prepared. The multi-layered structure may be formed by a semiconductor manufacturing processes for manufacturing a semiconductor device such as DRAM, VNAND, etc.

As illustrated in FIGS. 5 and 6, lower structures may be formed on a silicon substrate 200 by FEOL (front end of the line) process. The lower structure may include a first insulating interlayer 210, transistors (not illustrated) formed in the first insulating interlayer 210 and a lower wirings (not illustrated). For example, the lower wiring may include a contact plug.

After a second insulating interlayer 230 is formed on the first insulating interlayer 210, a landing pad 232 may be formed in the second insulating interlayer 230 to contact the contact plug. Then, after a mold layer 240 is formed on the second insulating interlayer 230, the mold layer may be partially etched to form contact holes 242 which expose the landing pads 232 respectively. The landing pads and the contact holes may be formed by performing a double pattering technology process once or several times. For example, the contact hole 242 may have a high aspect ratio of at least 1:5.

The landing pad 232 formed in the second insulating interlayer 230 may be a lower pattern which is formed in a lower layer by a first semiconductor process, and the contact hole 242 formed in the mold layer 240 may be an upper pattern which is formed in an upper layer by a second semiconductor process.

Capacitors may be formed to contact each of the landing pads 232 in the semiconductor device. For example, a cylindrical lower electrode may be formed on a sidewall of each contact hole and the exposed top surface of the landing pad 232, a dielectric layer and an upper electrode may be sequentially formed on the lower electrode to form the capacitor.

Referring to FIG. 7, in order to measure an overlay between the lower pattern (landing pad) and the upper pattern (contact hole), a high voltage electron beam may be irradiated on the multi-layered structure in FIG. 5 using the electron microscope in FIG. 1 to obtain a SEM image 10 of the landing pad and the contact hole.

The electron microscope may use the high voltage electron beam having an acceleration voltage of at least 10 kV to detect secondary electrons as well as backscattered electrons, to thereby obtain the SEM image representing upper and lower structures. Accordingly, the SEM image 10 may include an image of the landing pad (lower pattern) LP and an image of the contact hole (upper pattern) HP.

Then, a first image representing the upper pattern and a second image representing the lower pattern may be obtained from the actual image (S110).

Referring to FIGS. 8A and 8B, the SEM image may be divided into sub-images which represent different layers respectively. For example, a desired gray level range of the SEM image may be selected to divide the SEM image into a first image 12 of FIG. 8A representing the landing pad 232 in the lower layer and a second image 14 of FIG. 8B representing the contact hole 242 in the upper layer.

Then, each of the first and second images and a design image of the first and second patterns may be matched each other to determine an overlay between the upper pattern and the lower pattern (S120). In particular, a reference position for the upper and lower patterns may be determined from the design image (S122), and a position deviation of the upper pattern with respect to the reference position and a position deviation of the lower pattern with respect to the reference position may be calculated (S124).

Referring to FIGS. 9 to 11, a design image 15 of the landing pads and the contact holes may be used to determine a lattice point P1, P2 as the reference position for the landing pad and the contact hole, and then, a position deviation ($\vec{R}_{iB}$) of the lower pattern with respect to the reference position in the first image and a position deviation ($\vec{R}_{iA}$) of the upper pattern with respect to the reference position in the second image may be calculated.

First, a representative position of the landing pad in the first image 12 and a representative position of the contact hole in the second image 14 may be calculated. The pattern position calculation portion 140 of the image processing portion 136 may calculate a position center for the pattern as the representative position based on edge information of the pattern. As illustrated in FIG. 11, a centroid for each selected pattern may be calculated based on the edge information, and thus, the centroid (LCi) for i-th landing pad may be determined as the representative position of the lower pattern and the centroid (SCi) for i-th contact hole may be determined as the representative position of the upper pattern.

Then, the reference position for each landing pad LD may be determined from the design image 16 and the reference position for each contact hole HD may be determined from the design image 18. For example, a lattice point corresponding to each of the landing pad and the contact hole may be determined as the reference position from the design image. The lattice point P1 for each landing pad LD may be determined as the reference position in the design image 16 of the landing pads, and the lattice point P2 for each contact hole HD may be determined as the reference position in the design image 18 of the contact holes. The lattice point may be determined as one vertex or a centroid of a geometrical figure of the design image.

In example embodiments, the lattice point may be one common lattice for the landing pad and the contact hole. As illustrated in FIG. 11, one common lattice P1, P2 for the i-th landing pad and the i-th contact hole may be determined as the reference point in the design image 16, 18. Here, the lattice point P1 of the landing pad LD and the lattice point P2 of the contact hole HD may be overlapped with each other to be in the same position. Alternatively, the lattice point for the landing pad may be determined as the reference position for both of the landing pad and the contact hole or the lattice point for the contact hole may be determined as the reference position for both of the landing pad and the contact hole.

Then, after the position deviation ($\vec{R}_{iB}$) of the lower pattern with respect to the reference position in the first image and the position deviation ($\vec{R}_{iA}$) of the upper pattern with respect to the reference position in the second image are calculated, the position deviations may be compared to determine the overlay between the upper pattern and the lower pattern.

As illustrated in FIG. 11, the position deviation of the centroid (LCi) for the i-th landing pad with respect to the common lattice P1, P2 may be $\vec{R}_{iB}$, and the position deviation of the centroid (HCi) for the i-th contact hole with respect to the common lattice P1, P2 may be $\vec{R}_{iA}$. The overlay ($\vec{R}i$) between the i-th landing pad and the i-th contact hole overlapped with each other may be calculated by following Equation (1).

$$\vec{R}_i = \vec{R}_{iB} - \vec{R}_{iA} = OVL_{xi}\hat{x} + OVL_{yi}\hat{y} \qquad \text{Equation (1)}$$

Here, $OVL_{xi} = X_{Bi} - X_{Ai}$, $OVL_{yi} = Y_{Bi} - Y_{Ai}$

When N patterns to be measured are in field of view (FOV), average ($\overline{OVL}$) and standard deviation ($\sigma$) of the overlay measurements may be calculated by following Equation (2) and Equation (3).

$$\overline{OVL_x} = \sum_{i=1}^{N}(X_{Bi} - X_{Ai})/N, \qquad \text{Equation (2)}$$

$$\overline{OVL_y} = \sum_{i=1}^{N}(Y_{Bi} - Y_{Ai})/N$$

$$\sigma_x = \sqrt{\frac{1}{N-1}\sum_{i=1}^{N}(OVL_{xi} - \overline{OVL_x})^2}, \qquad \text{Equation (3)}$$

$$\sigma_y = \sqrt{\frac{1}{N-1}\sum_{i=1}^{N}(OVL_{yi} - \overline{OVL_y})^2}$$

Figure 12:
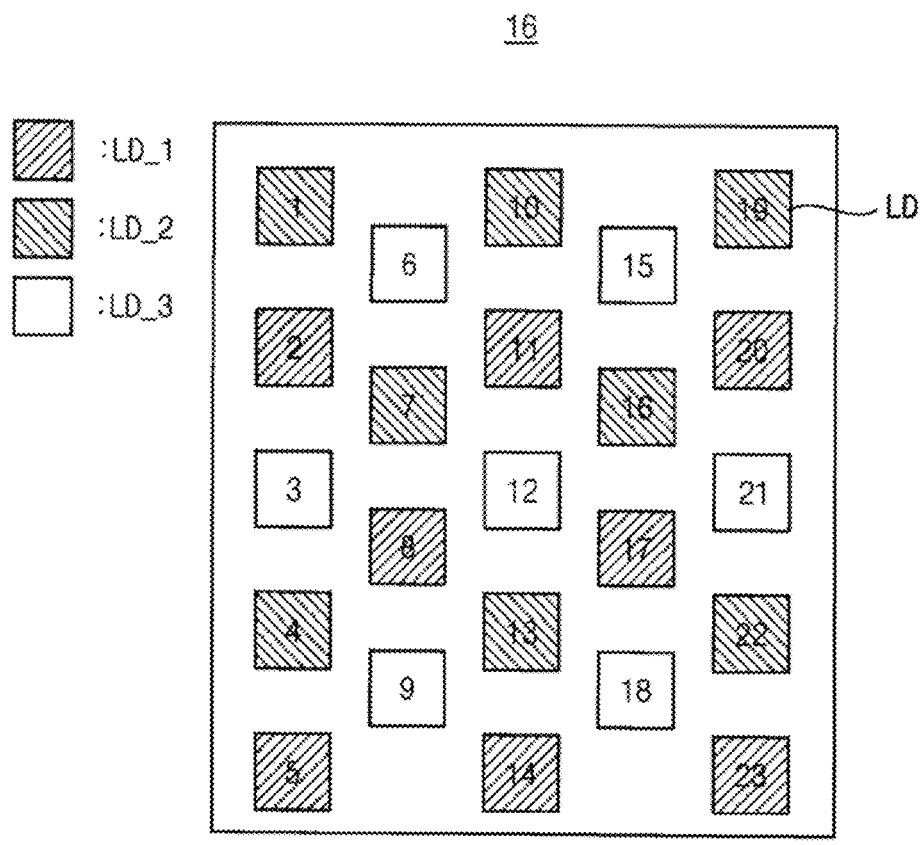
FIG. 12 illustrates a design image for the upper patterns in FIG. 9.

Referring to FIG. 12, the landing pads LD in the design image 16 for the landing pads may be numbered (i=1, 2, 3, . . . , 22, 23), average ($\overline{OVL}$) and standard deviation ($\sigma$) of the overlay measurements of the entire landing pads LD may be calculated by following Equation (4) and Equation (5).

$$\overline{OVL_x} = \sum_{i=1}^{23}(X_{Bi} - X_{Ai})/23, \qquad \text{Equation (4)}$$

$$\overline{OVL_y} = \sum_{i=1}^{23}(Y_{Bi} - Y_{Ai})/23$$

$$\sigma_x = \sqrt{\frac{1}{22}\sum_{i=1}^{23}(OVL_{xi} - \overline{OVL_x})^2}, \qquad \text{Equation (5)}$$

$$\sigma_y = \sqrt{\frac{1}{22}\sum_{i=1}^{23}(OVL_{yi} - \overline{OVL_y})^2}$$

In example embodiments, the landing pads 212 in FIG. 5 may be formed by performing a double pattering technology (DPT) process at least once, and the landing pads LD of the design image in FOV may be sorted into first landing pads LD_1, second landing pads LD_2 and third landing pads LD_3 in the order in which the landing pads are formed according to the performed processes. For example, the first and second landing pads 212 may be formed by performing DPT processes which use first and second photoresist patterns extending in different directions respectively. Here, an overlay of the first landing pad and the second landing pad formed in the same layer may be calculated based on the design image for the landing pads by following Equation (6), Equation (7) and Equation (8).

$$\overline{OVL_{x1}} = \sum_{i=1} (X_{Bi} - X_{Ai})/8,$$ Equation (6)

$$\overline{OVL_{y1}} = \sum_{i=1} (Y_{Bi} - Y_{Ai})/8$$

$$\overline{OVL_{x2}} = \sum_{j=1} (X_{Bi} - X_{Ai})/8,$$ Equation (7)

$$\overline{OVL_{y1}} = \sum_{j=1} (Y_{Bi} - Y_{Ai})/8$$

$$\overline{OVL_{x21}} = \overline{OVL_{x2}} - \overline{OVL_{x1}},$$ Equation (8)
$$\overline{OVL_{y21}} = \overline{OVL_{y2}} - \overline{OVL_{y1}}$$

Here, I=1, 4, 7, 10, 13, 16, 19, 22, j=2, 5, 8, 11, 14, 17, 20, 23.

As discussed above, the overlay measuring method may measure an overlay between a first semiconductor process (mother step) for forming landing pads and a second semiconductor process (child step) for forming contact holes, and compensate at least one of the first and second semiconductor processes based on the overlay measurement. For example, when the second semiconductor process is determined to be in an abnormal process state based on the overlay measurement, a process parameter of the process (for example, exposure correction) may be compensated, and then, the corrected process may proceed.

Additionally, the overlay measuring method may use SEM technology with a high voltage electron beam to obtain an overlay measurement of a pattern in a cell on a wafer in ACI (after cleaning inspection by a non-destructive manner, thereby efficiently monitoring semiconductor processes together with an optical overlay measurement technology.

Further, although the overlay measuring method is described as being applied to measure an overlay between a landing pad and a contact hole of a semiconductor device such as DRAM in the above example, it will be understood that the overlay measuring method may be applied to measure other features, e.g., an overlay between a gate bit line and an active bit line of DRAM, in-cell overlay between upper and lower patterns in a cell of FLASH or logic device, etc.

Hereinafter, a method of manufacturing a semiconductor device using the overlay measuring method of FIG. 3 will be explained.

Figure 19:
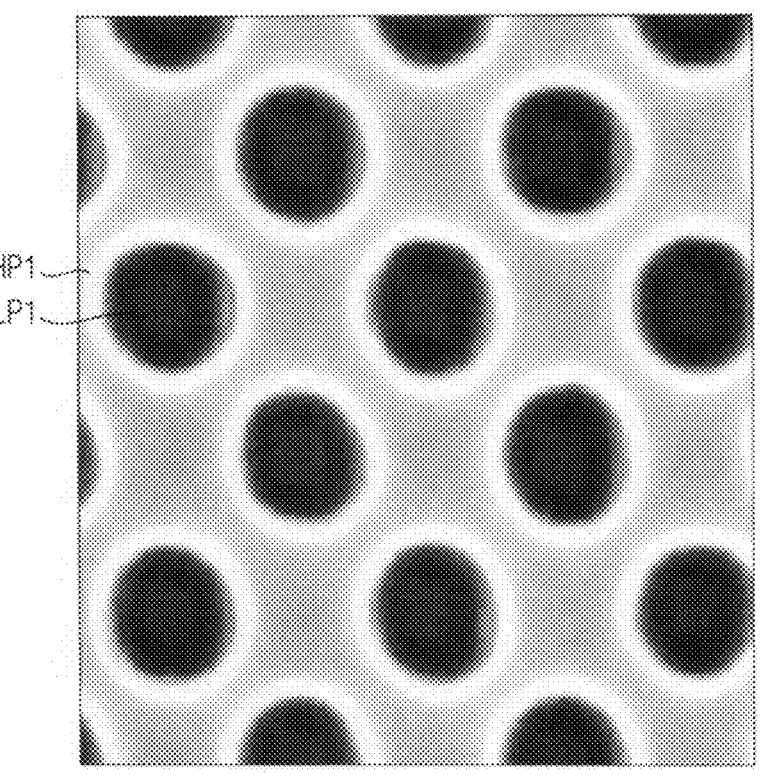
FIG. 19 illustrates a SEM image of a multi-layered structure in FIG. 17.
Figure 20:
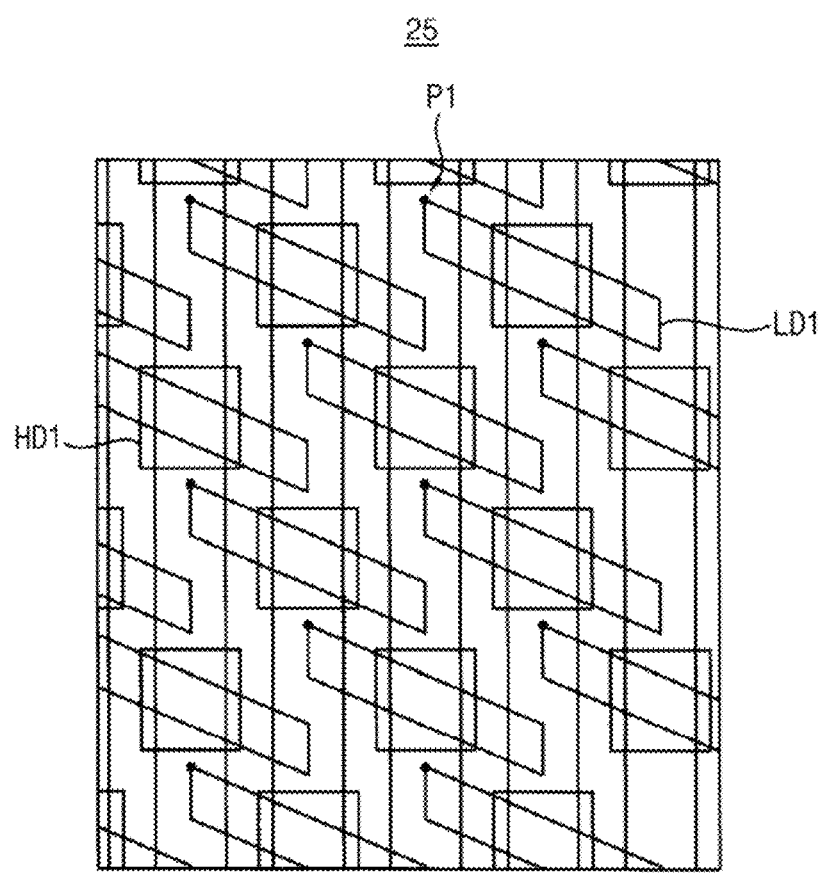
FIG. 20 illustrates a design image of an upper pattern and a lower pattern in FIG. 17.
Figure 21A:
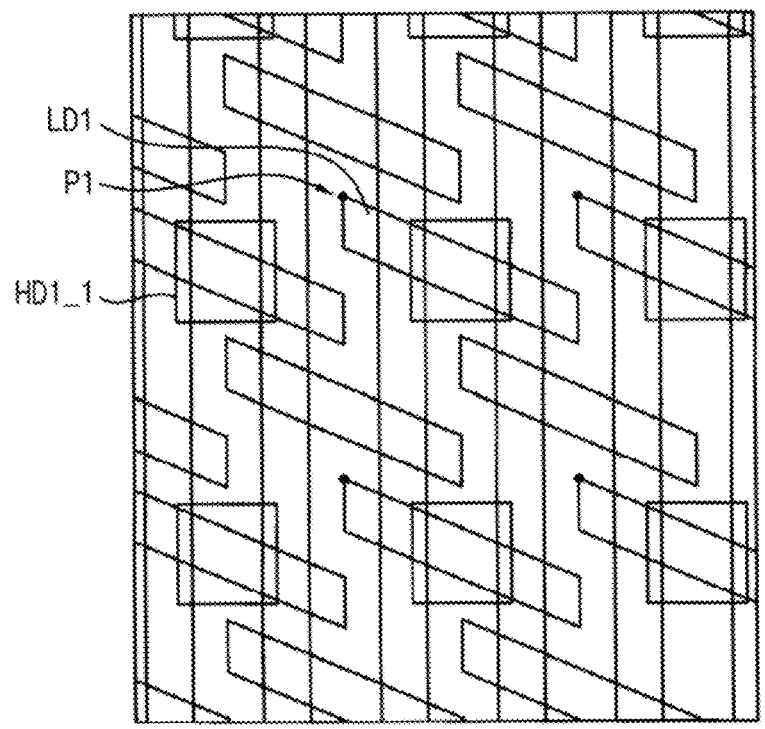
FIG. 21A illustrates a design image of a first group of the upper patterns and the lower pattern in FIG. 20.
Figure 21B:
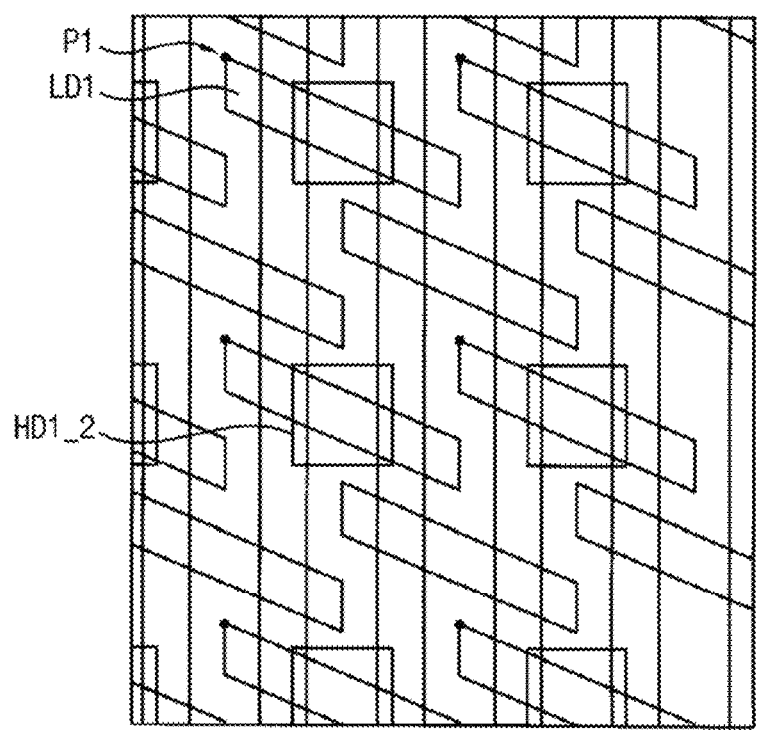
FIG. 21B illustrates a design image of a second group of the upper patterns and the lower pattern in FIG. 20.
Figure 26:
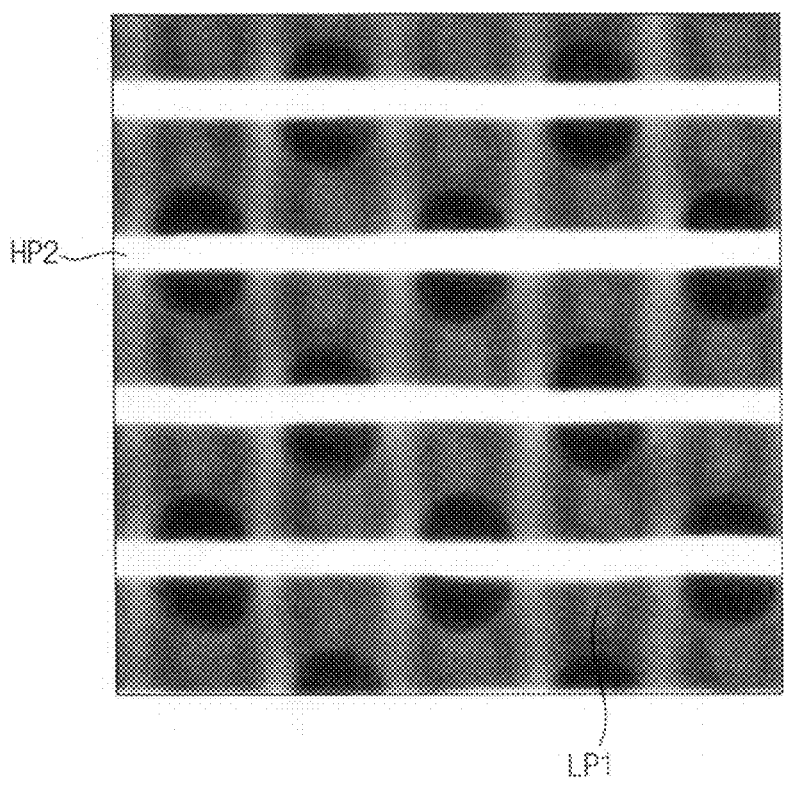
FIG. 26 illustrates a SEM image of a multi-layered structure in FIG. 24.
Figure 27:
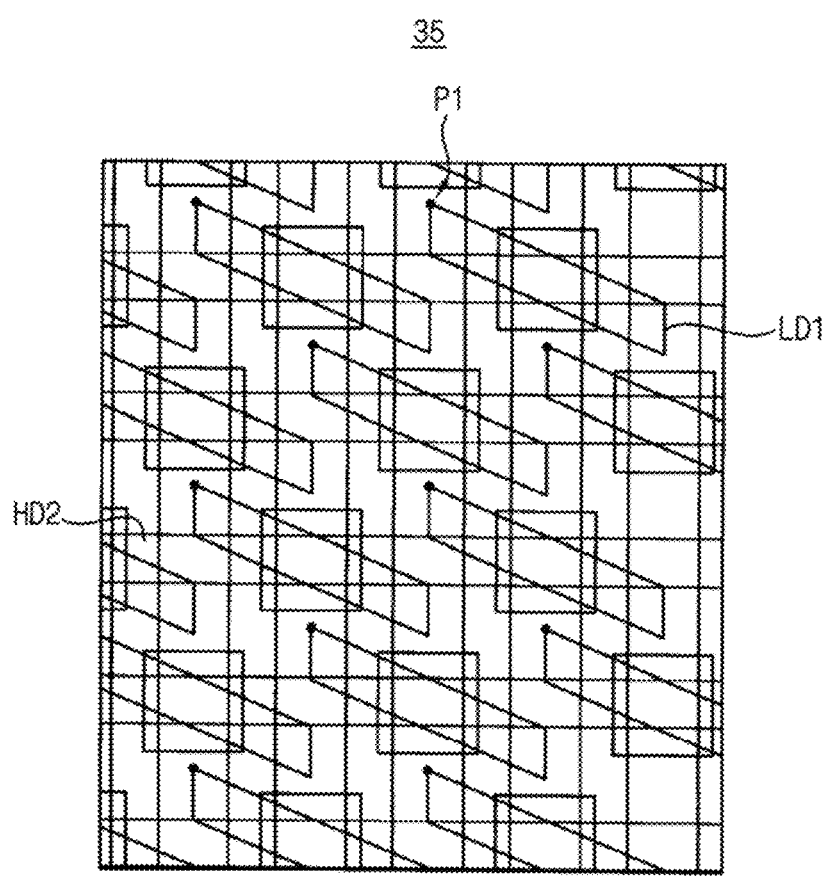
FIG. 27 illustrates a design image of an upper pattern and a lower pattern in FIG. 24.
Figure 34:
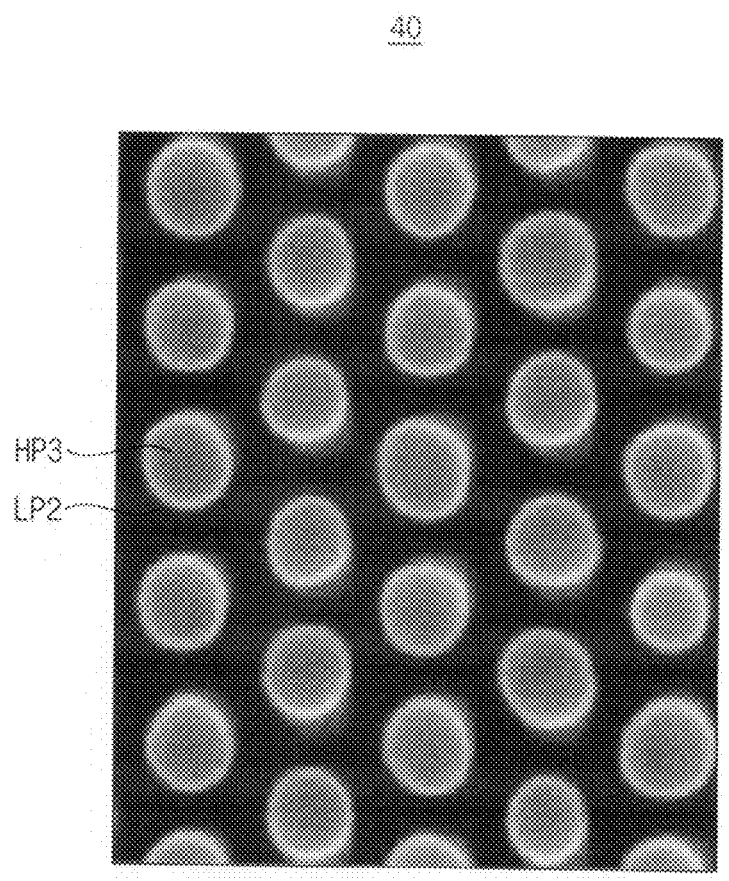
FIG. 34 illustrates a SEM image of a multi-layered structure in FIG. 32.
Figure 35:
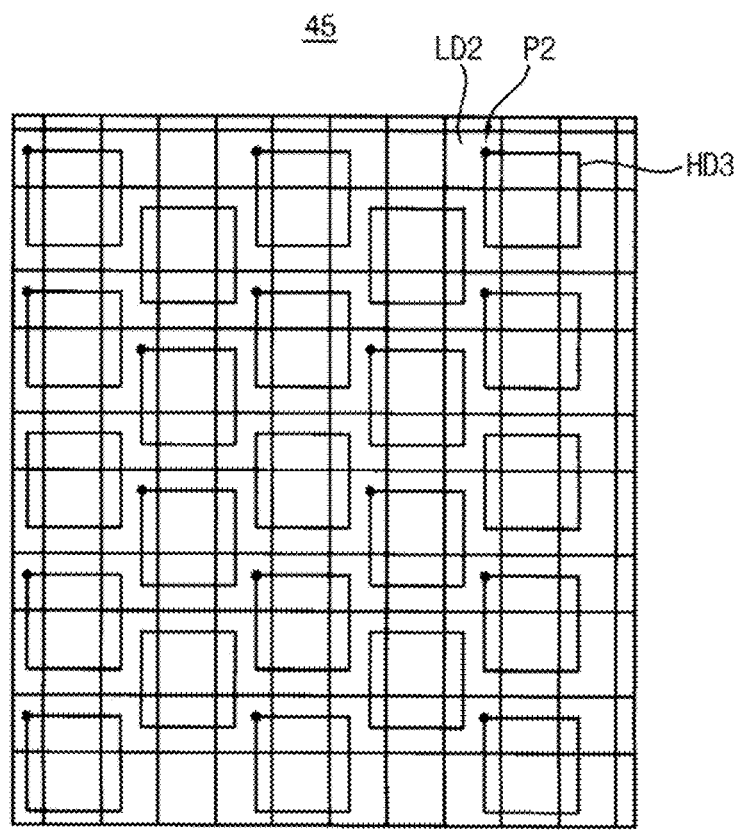
FIG. 35 illustrates a design image of an upper pattern and a lower pattern in FIG. 32.
Figure 36:
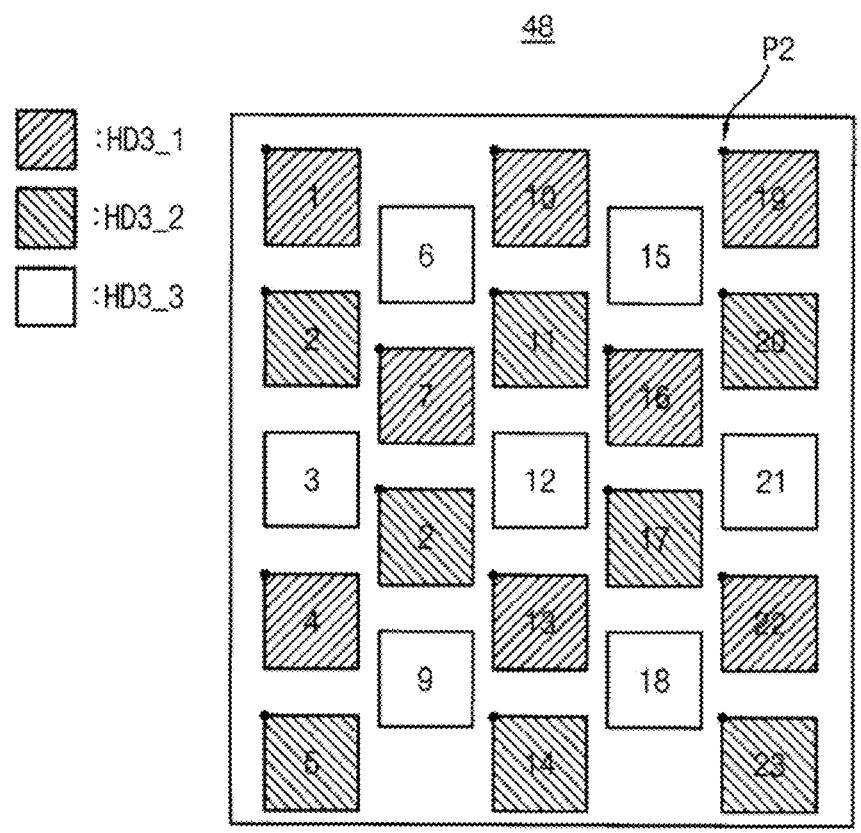
FIG. 36 illustrates a design image of the upper pattern in FIG. 35.
Figure 39:
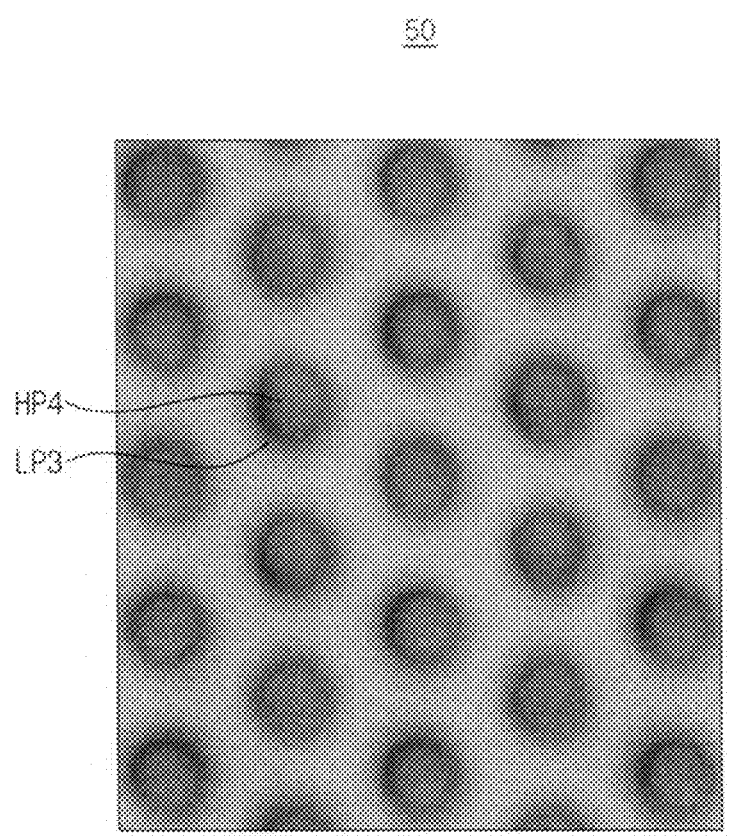
FIG. 39 illustrates a design image of multi-layered structure in FIG. 37.
Figure 40:
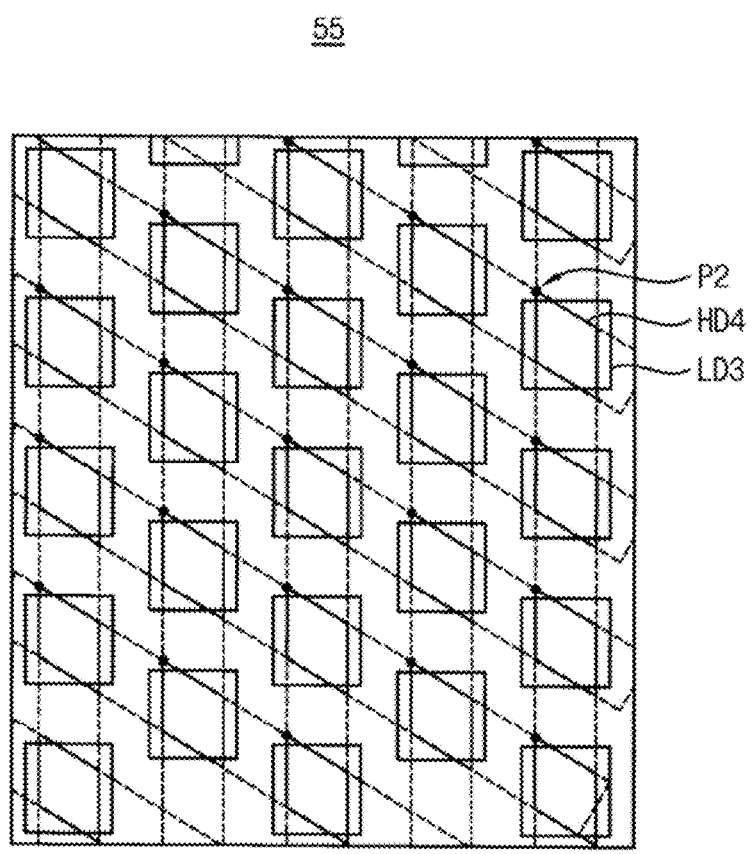
FIG. 40 illustrates a design image of an upper pattern and a lower pattern in FIG. 37.
Figure 41:
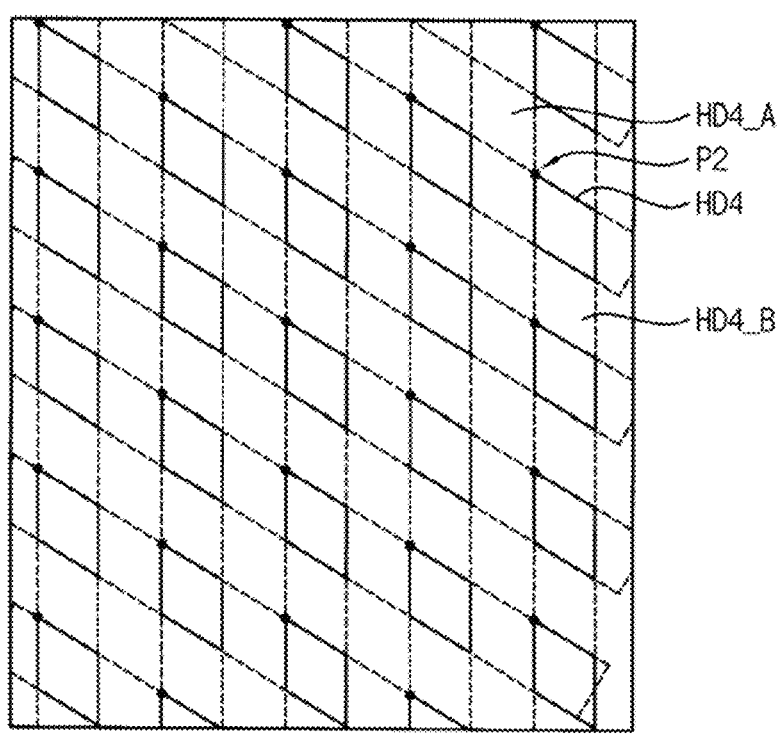
FIG. 41 illustrates a design image of the upper pattern in FIG. 40.

FIGS. 13, 15, 17, 22, 24, 28, 30, 32 and 37 are plan views illustrating stages of a method of manufacturing a semiconductor device in accordance with example embodiments. FIGS. 14, 16, 18, 23, 25, 29, 31, 33, 38 and 42 are cross-sectional views illustrating stages of a method of manufacturing the semiconductor device in accordance with example embodiments. FIG. 19 is a SEM image of a multi-layered structure in FIG. 17. FIG. 20 is a design image of an upper pattern and a lower pattern in FIG. 17. FIG. 21A is a design image of a first group of the upper patterns and the lower pattern in FIG. 20. FIG. 21B is a design image of a second group of the upper patterns and the lower pattern in FIG. 20. FIG. 26 is a SEM image of a multi-layered structure in FIG. 24. FIG. 27 is a design image of an upper pattern and a lower pattern in FIG. 24. FIG. 34 is a SEM image of a multi-layered structure in FIG. 32. FIG. 35 is a design image of an upper pattern and a lower pattern in FIG. 32. FIG. 36 is a design image of the upper pattern in FIG. 35. FIG. 39 is a design image of multi-layered structure in FIG. 37. FIG. 40 is a design image of an upper pattern and a lower pattern in FIG. 37. FIG. 41 is a design image of the upper pattern in FIG. 40.

Each of the cross-sectional views includes cross-sections of the corresponding plan view cut along lines G-G', H-H', K-K' and L-L', respectively. The lines G-G' and H-H' extend in a second direction substantially parallel to a top surface of a substrate, and the lines K-K' and L-L' extend in a first direction substantially parallel to the top surface of the substrate and substantially perpendicular to the second direction.

Figure 13:
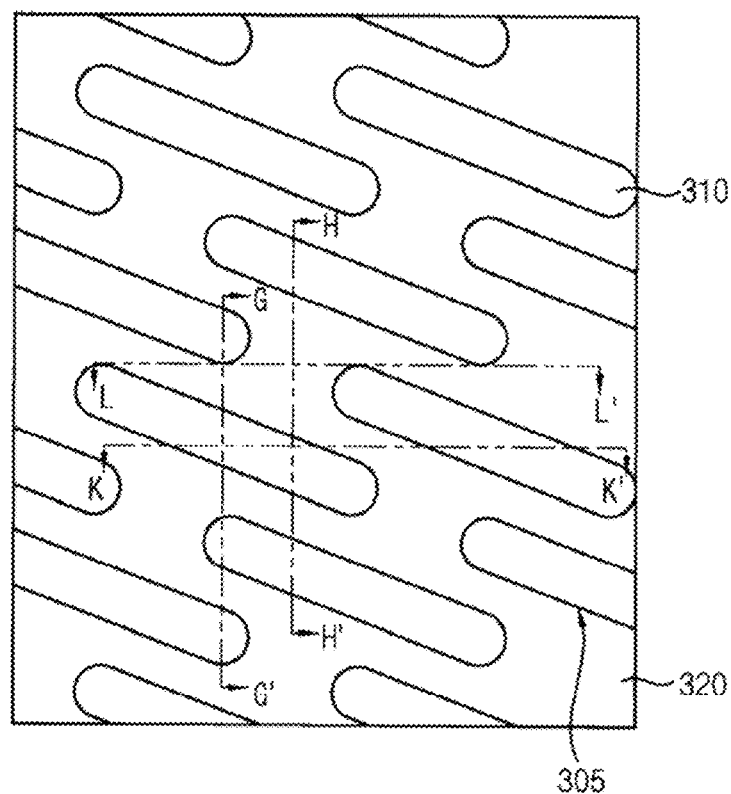
FIGS. 13, 15, 17, 22, 24, 28, 30, 32 and 37 illustrate plan views illustrating stages of a method of manufacturing a semiconductor device in accordance with example embodiments.
Figure 13:
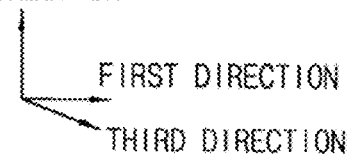
Figure 14:
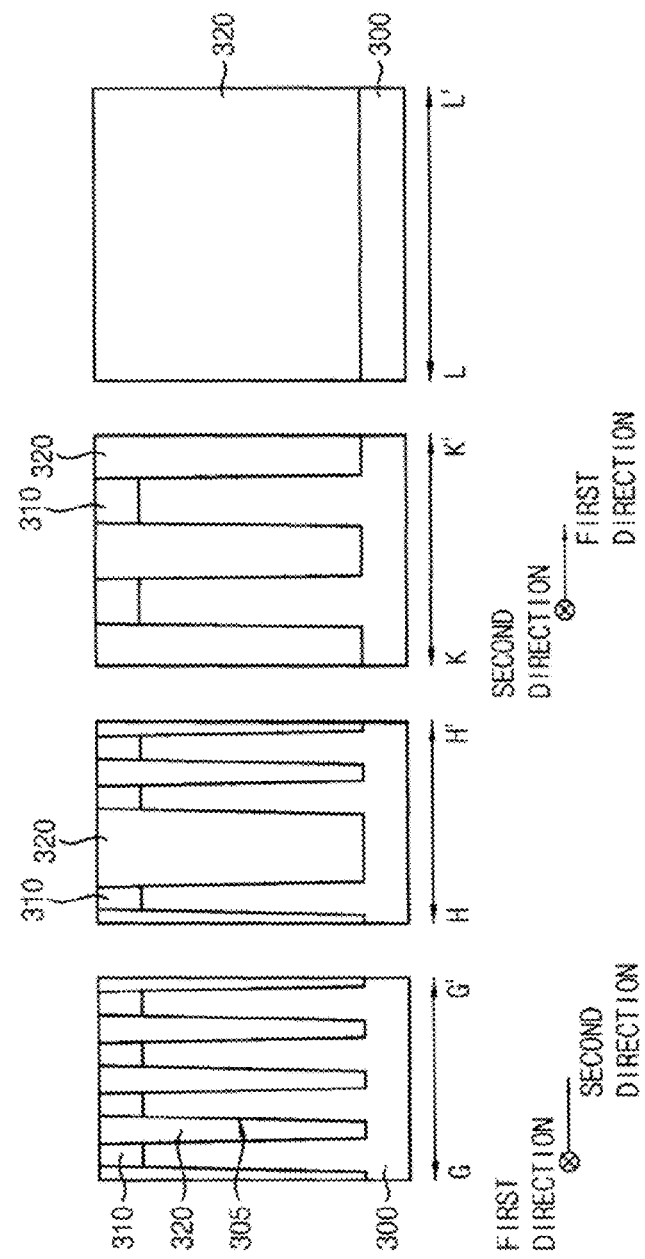

Referring to FIGS. 13 and 14, an isolation layer pattern 320 may be formed on a substrate 300.

In particular, a first hard mask 310 may be formed on the substrate 300, and an upper portion of the substrate 300 may be etched using the first hard mask 310 as an etching mask to form a first trench 305. For example, the substrate 300 may be a silicon substrate, a germanium substrate, a silicon-germanium substrate, a silicon-on-insulator (SOI) substrate, a germanium-on-insulator (GOI) substrate, etc. The first hard mask 310 may be formed to include a nitride, e.g., silicon nitride.

An isolation layer may be formed on the substrate 300 to sufficiently fill the first trench 305, and an upper portion of the isolation layer may be planarized until a top surface of the substrate 300 may be exposed to form an isolation layer pattern 320 in the first trench 305. The isolation layer may be formed to include an oxide, e.g., silicon oxide.

A region of the substrate 300 on which the isolation layer pattern 320 is formed may be defined as a field region, and a region of the substrate 300 on which no isolation layer pattern is formed may be defined as an active region. In example embodiments, a plurality of active regions may be formed, and each active region may extend in a third direction that is substantially parallel to the top surface of the substrate 300, however, neither parallel nor perpendicular to the first and second directions.

Impurities may be implanted into upper portions of the substrate 300 to form impurity regions (not shown). The impurity regions may form a transistor together with a first gate structure 360 (refer to FIG. 16) subsequently formed, and may serve as source/drain regions of the transistor.

Figure 15:
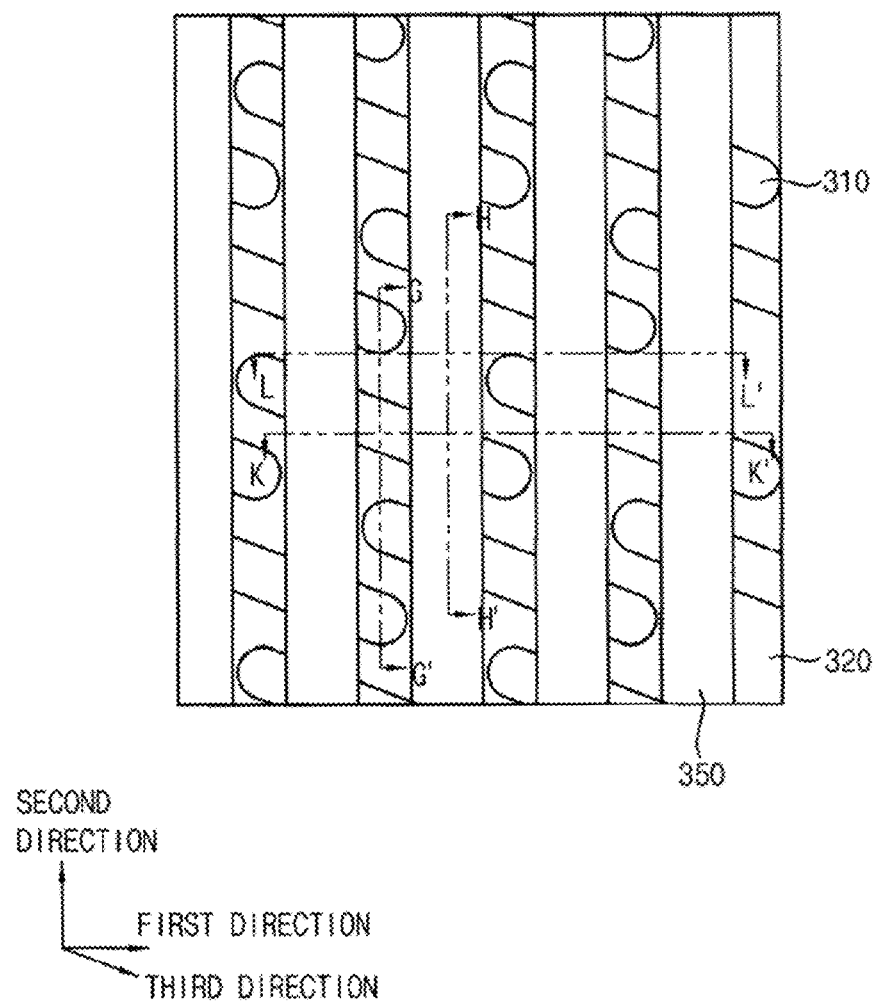
Figure 16:
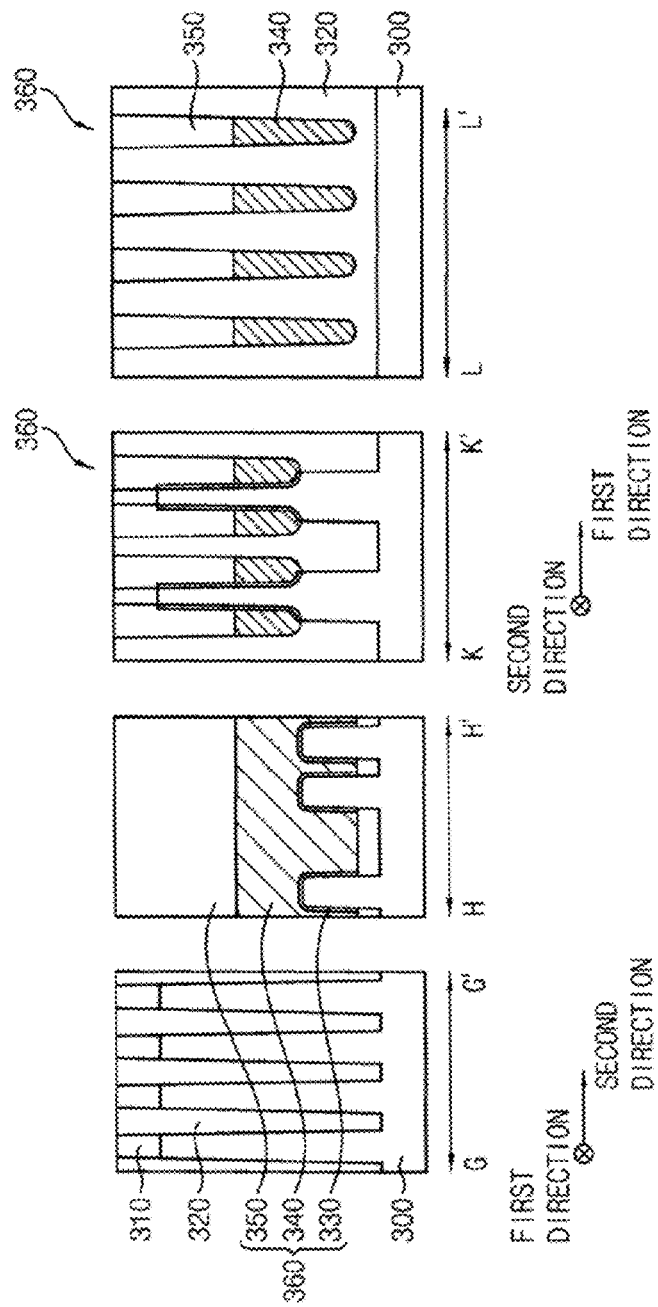

Referring to FIGS. 15 and 16, a gate structure 360 may be formed on the substrate 300, on which the isolation layer pattern 320 is formed.

The first hard mask 310, the substrate 300 and the isolation layer pattern 320 may be partially removed to form second trenches each of which may extend in the second direction. The second trenches may be formed to have different depths at the substrate 300 and the isolation layer pattern 320 according to the etching selectivity therebetween. In example embodiments, two second trenches may be formed in each active region of the substrate 300.

A gate insulation layer 330 may be formed on upper surfaces of the substrate 300 exposed by the second trenches, and a gate electrode 340 and a capping layer pattern 350 may be sequentially formed in each second trench. The gate electrode 340 may fill a lower portion of each second trench and the capping layer pattern 350 may fill an upper portion of each second trench. In example embodiments, the gate insulation layer 330 may be formed by a thermal oxidation process or a chemical vapor deposition (CVD) process, and thus may be formed to include an oxide, e.g., silicon oxide.

The gate electrode 340 may be formed by forming a gate electrode layer on the gate insulation layer 330, the first hard mask 310 and the isolation layer pattern 320 to sufficiently fill the second trenches, and removing an upper portion of the gate electrode layer through an etch back process and/or a chemical mechanical polishing (CMP) process. The gate electrode layer may be formed to include a metal, e.g., tungsten, titanium, tantalum, etc., or a metal nitride, e.g., tungsten nitride, titanium nitride, tantalum nitride, etc.

The capping layer pattern 350 may be formed by forming a capping layer on the gate electrode 340, the gate insulation layer 330, the first hard mask 310 and the isolation layer pattern 320 to sufficiently fill remaining portions of the second trenches, and planarizing an upper portion of the capping layer until top surfaces of the first hard mask 310 and the isolation layer pattern 320 may be exposed. The capping layer may be formed to include a nitride, e.g., silicon nitride.

By the above process, the gate structure 360 including the gate insulation layer 330, the gate electrode 340 and the capping layer pattern 350 may be formed in each second trench. In example embodiments, the gate structure 360 may extend in the second direction.

Figure 17:
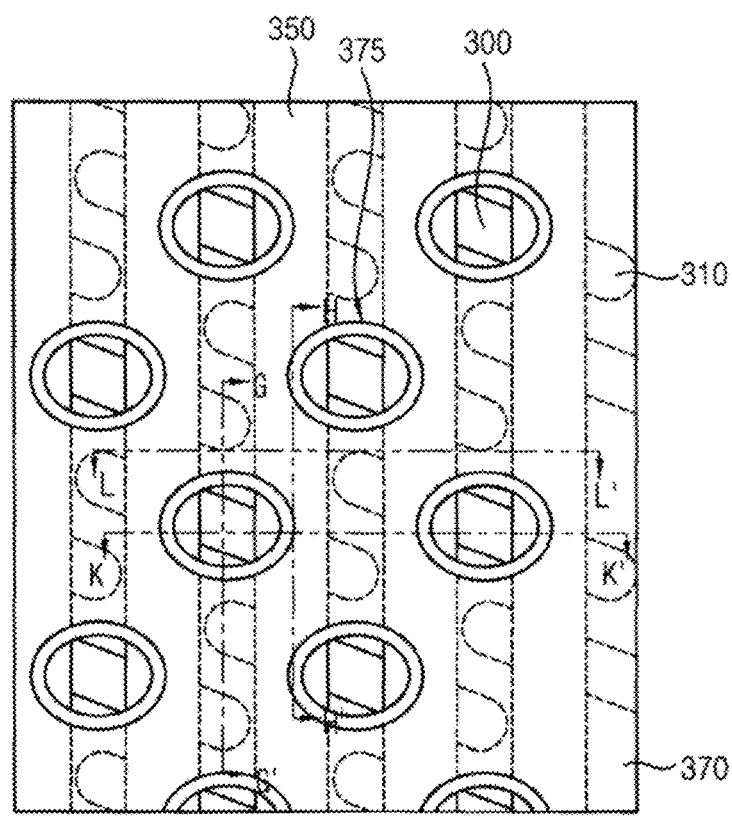
Figure 17:
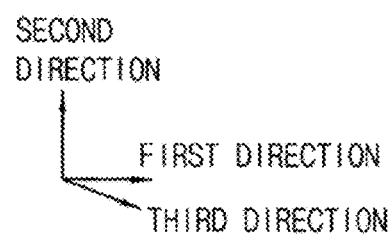
Figure 18:
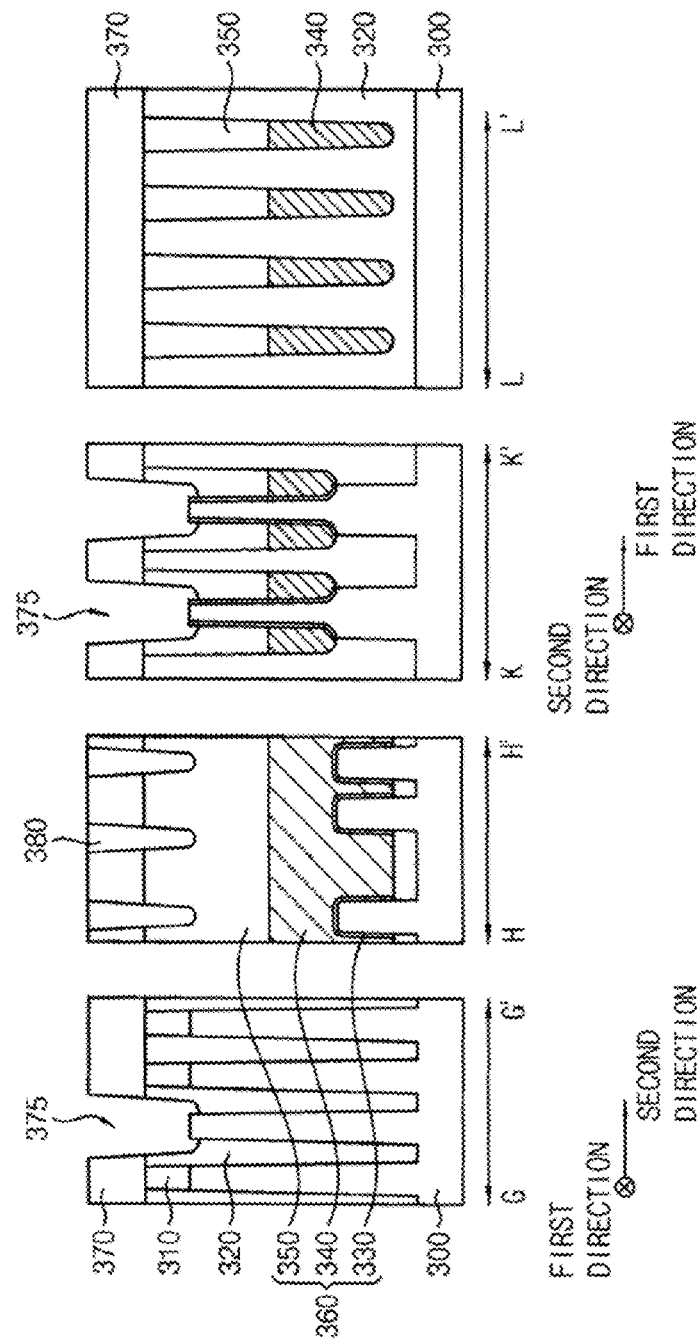

Referring to FIGS. 17 and 18, a first insulating interlayer 370 may be formed on the substrate 300 to cover the gate structure 360, and then, first contact holes 375 may be formed to expose each active region of the substrate 300.

The first insulating interlayer 370 may be formed on the first hard mask 310, the isolation layer pattern 320 and the capping layer pattern 350, and then, the first insulating interlayer 370 and the first hard mask 310 may be partially removed to form the first contact holes 375 exposing the active regions of the substrate 300, respectively. In example embodiments, each first contact hole 375 may expose a central top surface of each active region. When the first contact holes 375 are formed, the capping layer pattern 350 and the isolation layer pattern 320 may be also partially removed.

Referring to FIGS. 19 to 21B, an overlay between the active region (lower pattern) and the first contact hole 375 (upper pattern) may be measured using the overlay measuring method described with reference to FIGS. 1 to 4.

As illustrated in FIG. 19, a high voltage electron beam may be irradiated on a multi-layered structure in FIG. 17 using the electron microscope in FIG. 1 to obtain a SEM image 20 of the active region and the first contact hole.

In example embodiments, the electron microscope may use the high voltage electron beam having an acceleration voltage of at least 10 kV to detect secondary electrons as well as backscattered electrons, to thereby obtain the SEM image representing upper and lower structures. Accordingly, the SEM image 20 may include an image of the active region (lower pattern) LP1 and an image of the first contact hole (upper pattern) HP1.

Further, a desired gray level range of the SEM image may be selected to divide the SEM image 20 into a first image representing the active region 300 in a lower layer and a second image representing the first contact hole 375 in an upper layer. Then, a representative position of the active region in the first image and a representative position of the first contact hole in the second image may be calculated. For example, based on edge information of the pattern, a position center for the active region may be calculated in the first image and a position center for the first contact hole may be calculated in the second image.

As illustrated in FIG. 20, a reference position for each active region LD1 and a reference position for each first contact hole HD1 may be determined from a design image 25 of the active patterns and the first contact holes. In example embodiments, a lattice point P1 may be determined as the reference position for each the active region LD1 and for each the first contact hole HD1 in the design image 25 of the active regions and the first contact holes. The lattice point may be one common lattice for the active region and the first contact hole. That is, the lattice point P1 at one vertex of the active region may be determined as the reference point for the actual active pattern and the actual first contact hole pattern.

Then, after a position deviation ($\vec{R}_{iB}$) of the lower pattern (active region) in the first image with respect to the reference position P1 and a position deviation ($\vec{R}_{iA}$) of the upper pattern (first contact hole) in the second image with respect to the reference position P1 are calculated, the position deviations may be compared to determine the overlay between the upper pattern and the lower pattern.

Referring again to FIGS. 21A and 21B, the first contact holes 375 in FIG. 17 may be formed by performing a DPT process at least once, and the first contact holes of the design image may be sorted into first and second groups of first contact holes HD_1, HD_2. After an overlay of the first group of the first contact holes HD_1 and an overlay of the second group of the first contact holes HD_2 are measured, the overlay measurements may be compared with each other to determine an overlay between the first contact holes formed in the same layer.

Figure 22:
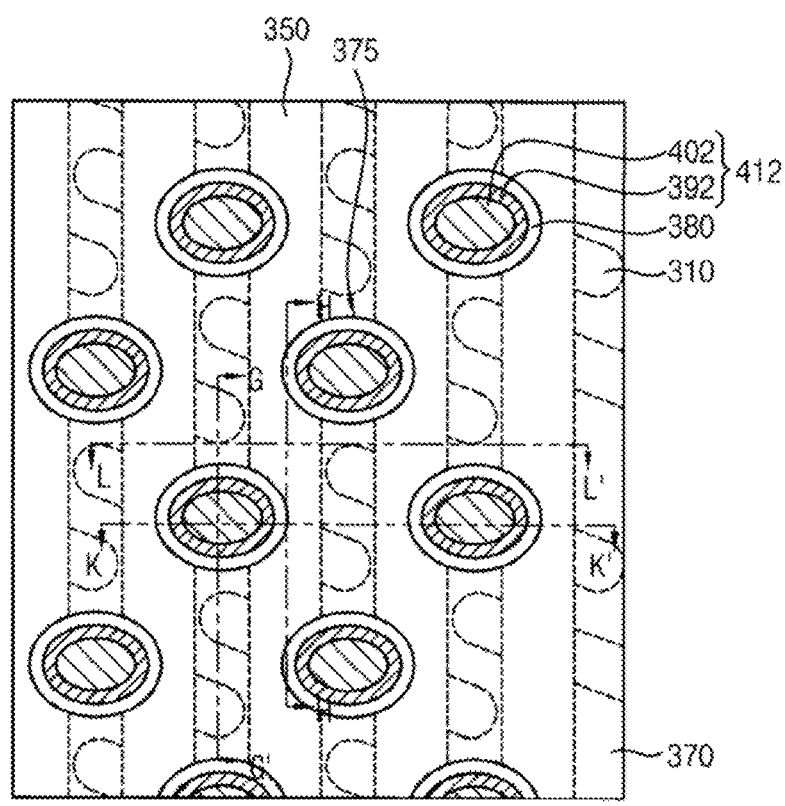
Figure 23:
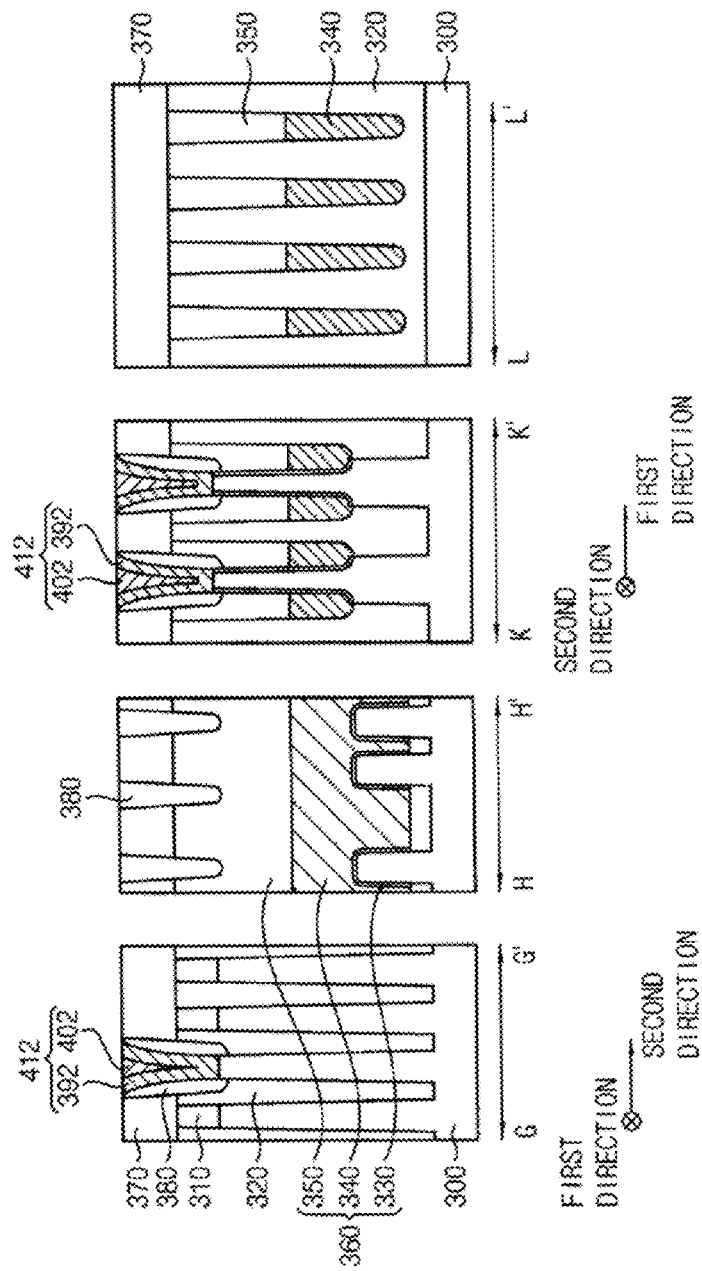

Referring to FIGS. 22 and 23, first contact plugs 412 may be formed to fill the first contact holes 372 respectively.

A first spacer 380 may be formed on a sidewall of each first contact hole 375. The first spacers 380 may be formed by forming a first spacer layer on the sidewalls of the first contact holes 375, the exposed top surface of the active regions and the first insulating interlayer 370, and anisotropically etching the first spacer layer. The first spacer layer may be formed to include a nitride, e.g., silicon nitride.

The first contact plug 412 filling a remaining portion of each first contact hole 375 may be formed on the exposed top surface of the active region and the first spacer 380. The first contact plug 412 may include a first metal layer pattern 402 and a barrier layer pattern 392 surrounding the first metal layer pattern 402.

The first contact plugs 412 may be formed by forming a barrier layer on the exposed top surface of the active regions, the first spacers 380 and the first insulating interlayer 370, forming a first metal layer to sufficiently fill remaining portions of the first contact holes 375, and planarizing upper portions of the barrier layer and the first metal layer until a top surface of the first insulating interlayer 370 may be exposed. The barrier layer may be formed to include a metal nitride, e.g., tungsten nitride, titanium nitride, tantalum nitride, etc., and the first metal layer may be formed to include a metal, e.g., tungsten, aluminum, copper, etc. In another implementation, the first contact plugs 412 may be formed to include doped polysilicon.

Figure 24:
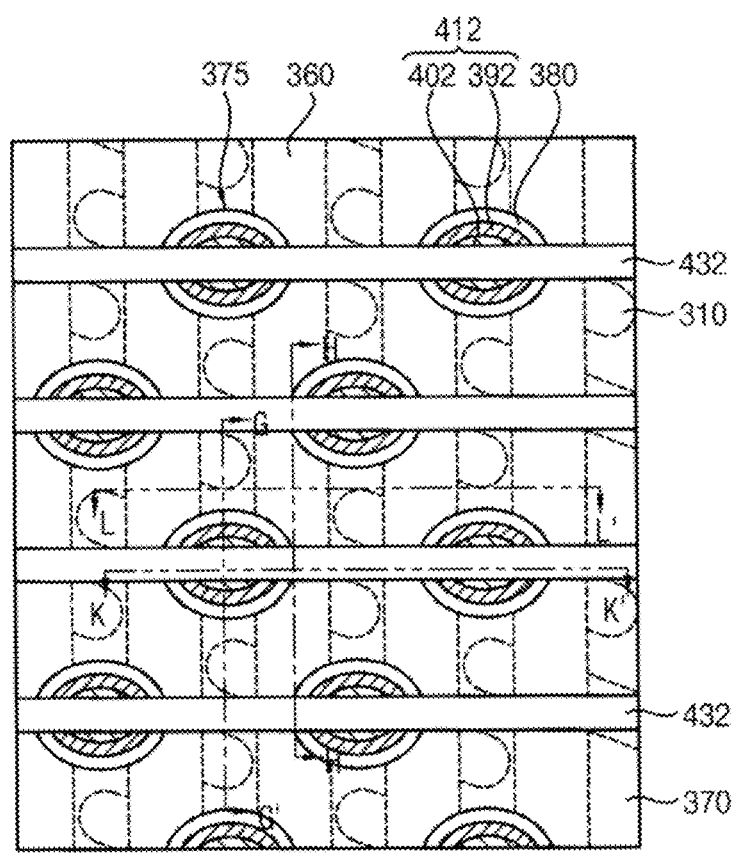
Figure 24:
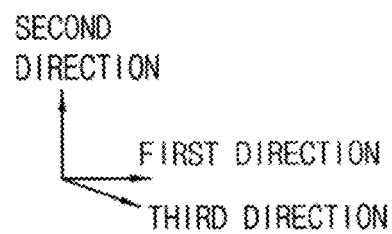
Figure 25:
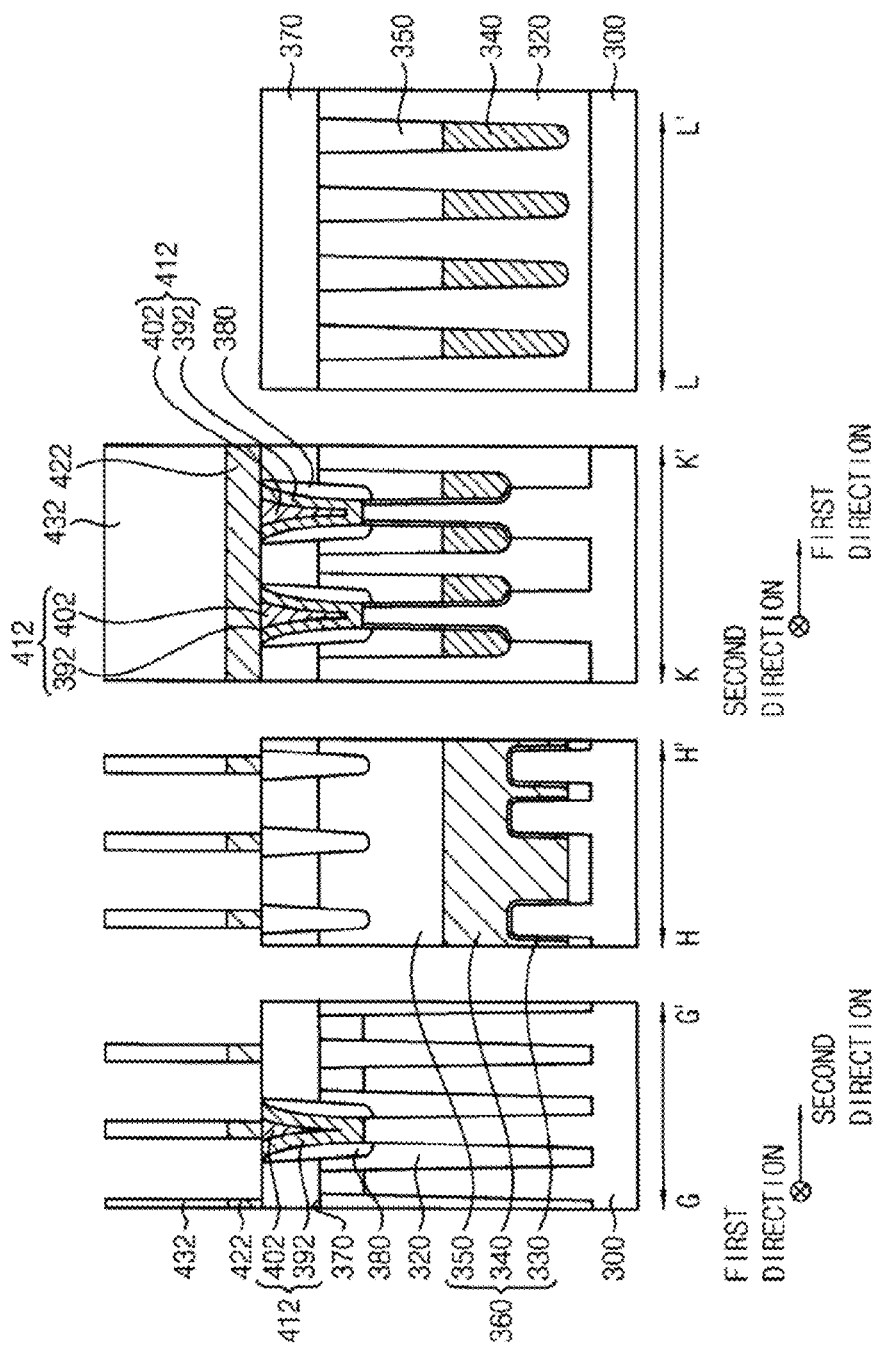

Referring to FIGS. 24 and 25, a bit line 422 and a second hard mask 432 may be sequentially formed on the first insulating interlayer 370 to contact the first plugs 412.

The bit line 422 and the second hard mask 432 may be formed by sequentially forming a second metal layer and a second hard mask layer on the first insulating interlayer 370, the first contact plugs 412 and the first spacers 380, and patterning the second hard mask layer and the second metal layer through a photolithography process. In example embodiments, each of the bit line 422 and the second hard mask 432 may extend in the first direction, and a plurality of bit lines 422 and a plurality of second hard mask 432 may be formed in the second direction.

The second metal layer may be formed to include a metal, e.g., tungsten, aluminum, copper, etc., and the second hard mask layer may be formed to include a nitride, e.g., silicon nitride.

Referring to FIGS. 26 and 27, an overlay between the active region (lower pattern) and the bit line 422 (upper pattern) may be measured using the overlay measuring method described with reference to FIGS. 1 to 4.

As illustrated in FIG. 26, a high voltage electron beam having an acceleration voltage of at least 10 kV may be irradiated on a multi-layered structure in FIG. 24 to obtain a SEM image 30 of the active region and the bit line. The SEM image 30 may include an image of the active region (lower pattern) LP1 and an image of the bit line (upper pattern) HP2.

Further, a desired gray level range of the SEM image may be selected to divide the SEM image 30 into a first image representing the active region 300 in a lower layer and a second image representing the bit line 422 in an upper layer. Then, a representative position of the active region in the first image and a representative position of the bit line in the second image may be calculated. For example, based on edge information of the pattern, a position center for the active region may be calculated in the first image and a position center for the bit line may be calculated in the second image.

The active region may have a two-dimensional isolated shape, and the bit line may have a one-dimensional linear shape extending in the first direction. The position center for the active region may have two-dimensional position information and the position center for the bit line may have one-dimensional position information.

As illustrated in FIG. 27, a reference position for each active region LD1 and a reference position for each bit line HD2 may be determined from a design image 35 of the active patterns and the bit lines. In example embodiments, a lattice point P1 may be determined as the reference position for each the active region LD1 and for each the bit line HD2 in the design image 35 of the active regions and the bit lines. The lattice point may be one common lattice for the active region and the bit line. That is, the lattice point P1 at one vertex of the active region may be determined as the reference point for the actual active pattern and the actual bit line pattern.

Then, after a position deviation ($\vec{R}_{iB}$) of the lower pattern (active region) in the first image with respect to the reference position P1 and a position deviation ($\vec{R}_{iA}$) of the upper pattern (first contact hole) in the second image with respect to the reference position P1 are calculated, the position deviations may be compared to determine the overlay between the upper pattern and the lower pattern.

Figure 28:
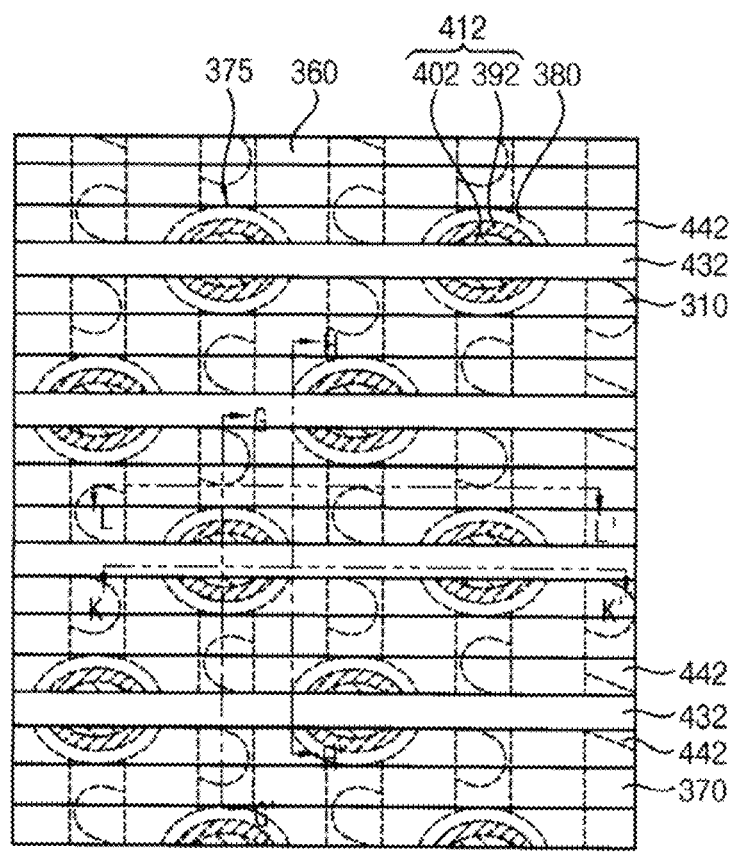
Figure 29:
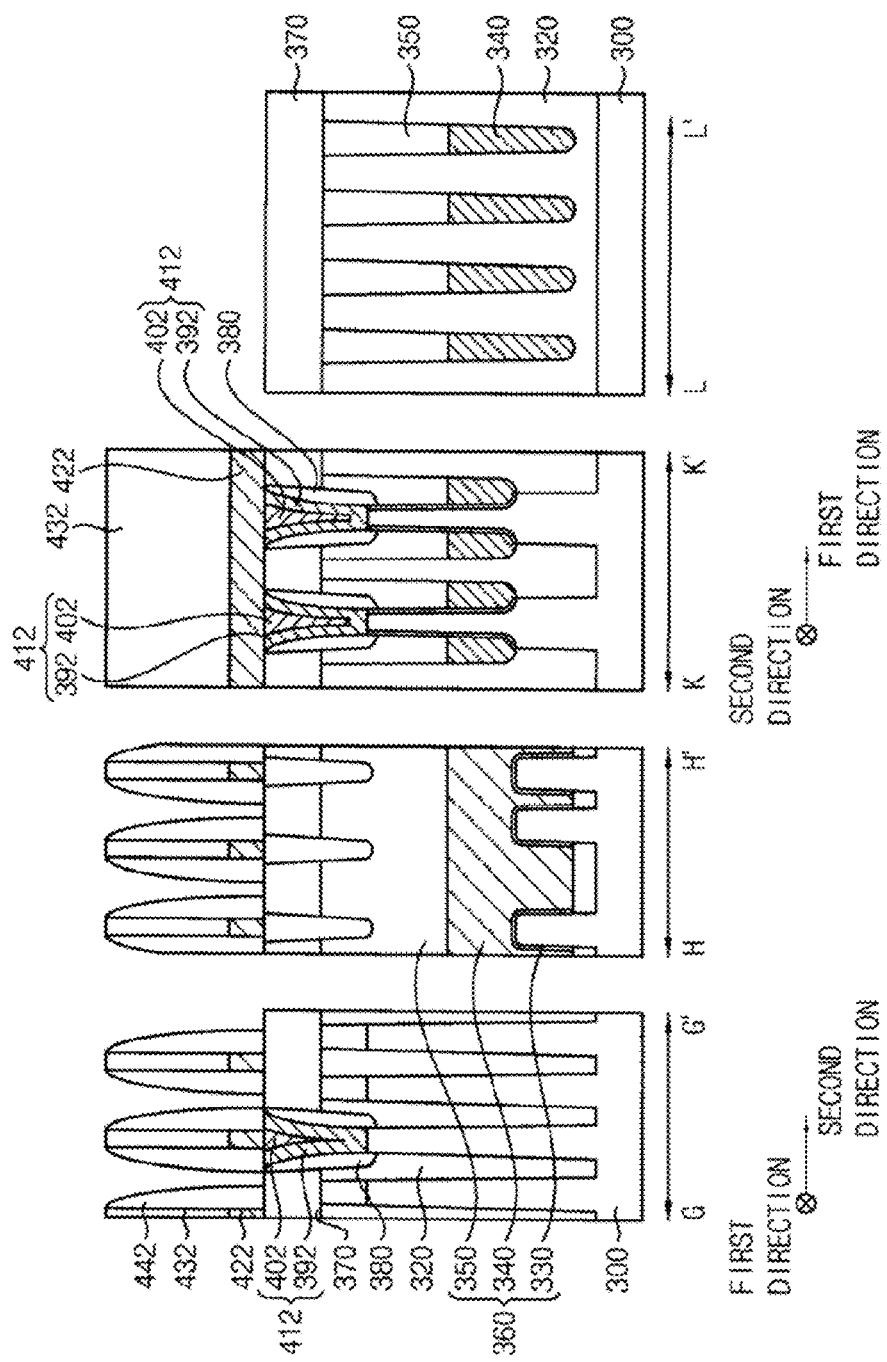

Referring to FIGS. 28 and 29, a second spacer 442 may be formed on sidewalls of each bit line 422 and each second hard mask 432.

The second spacers 442 may be formed by forming a second spacer layer on the bit lines 422, the second hard masks 432, the first contact plugs 412 and the first insulating interlayer 370, and anisotropically etching the second spacer layer. The second spacer layer may be formed to include a nitride, e.g., silicon nitride. In example embodiments, the second spacer 442 may extend in the first direction, and a plurality of second spacers 442 may be formed in the second direction.

The bit line 422, the second hard mask 432 and the second spacer 442 may define a bit line structure.

Figure 30:
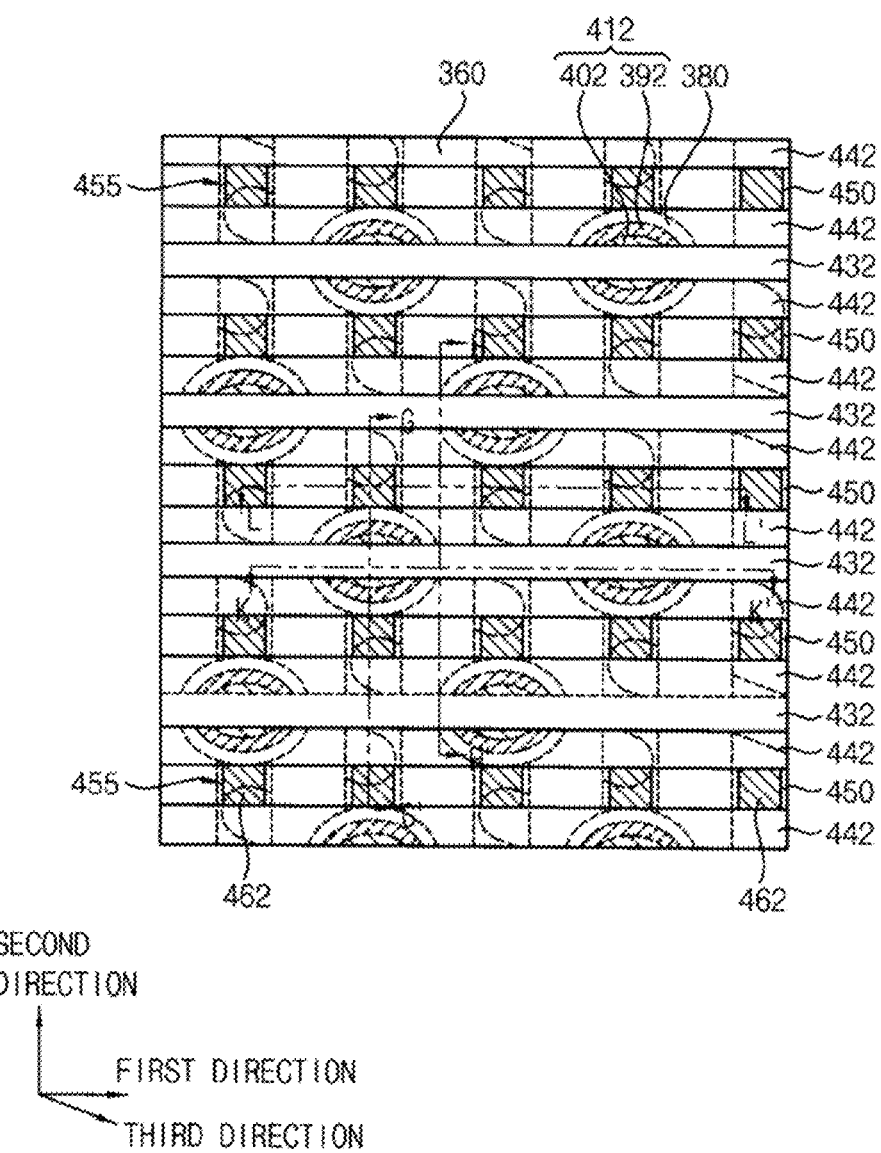
Figure 31:
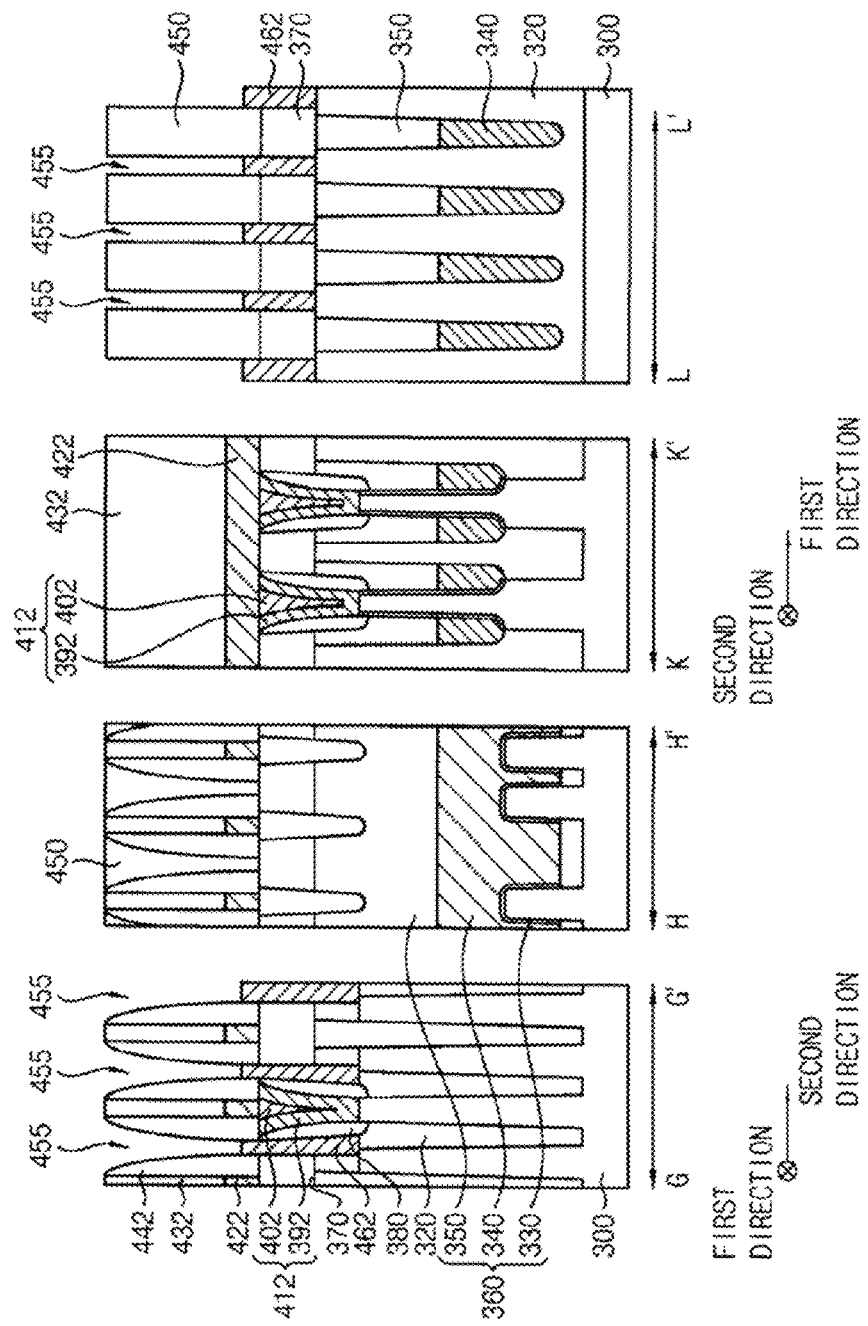

Referring to FIGS. 30 and 31, a second insulating interlayer 450 may be formed to cover the bit line structures, and second contact holes 455 may be formed to expose each of the active regions of the substrate 300. Then, a second contact plug 462 may be formed to fill a lower portion of each of the second contact holes 455.

The second insulating interlayer 450 may be formed on the first insulating interlayer 370 to cover the bit line structures, and the second insulating interlayer 450, the first insulating interlayer 370 and the first hard mask 310 may be partially etched to form the second contact holes 455 exposing top surfaces of the active regions, respectively. When the second contact holes 455 are formed, the isolation layer pattern 320 may be partially etched. In example embodiments, a plurality of second contact holes 455 may be formed in the first direction between the bit line structures. In example embodiments, the second contact holes 455 may be formed to be self-aligned with the bit line structures, and two second contact holes 455 may be formed on each active region.

The second contact plug 462 filling the lower portion of each second contact hole 455 may be formed. The second contact plugs 462 may be formed by forming a first conductive layer on the exposed top surfaces of the active regions, the bit line structures and the second insulating interlayer 450 to sufficiently fill the second contact holes 455, and removing an upper portion of the first conductive layer. The first conductive layer may be formed to include, e.g., doped polysilicon.

Metal silicide patterns (not shown) may be further formed on top surfaces of the second contact plugs 462, thereby reducing a resistance between the second contact plugs 462 and landing pads 472 (refer to FIGS. 32 and 33) subsequently formed.

Figure 32:
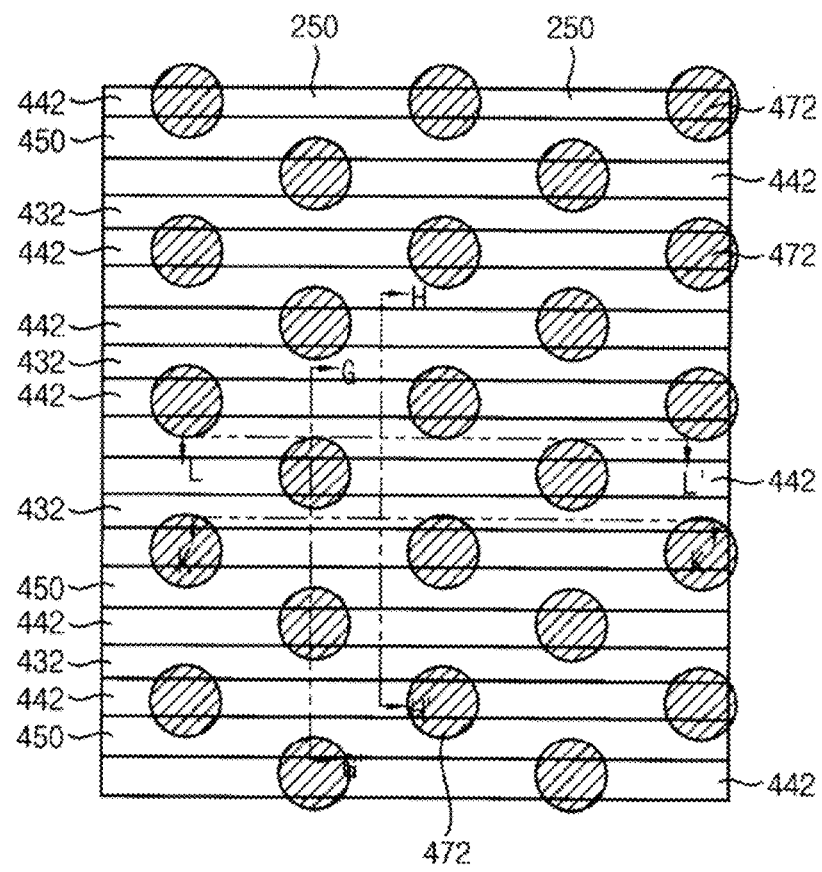
Figure 33:
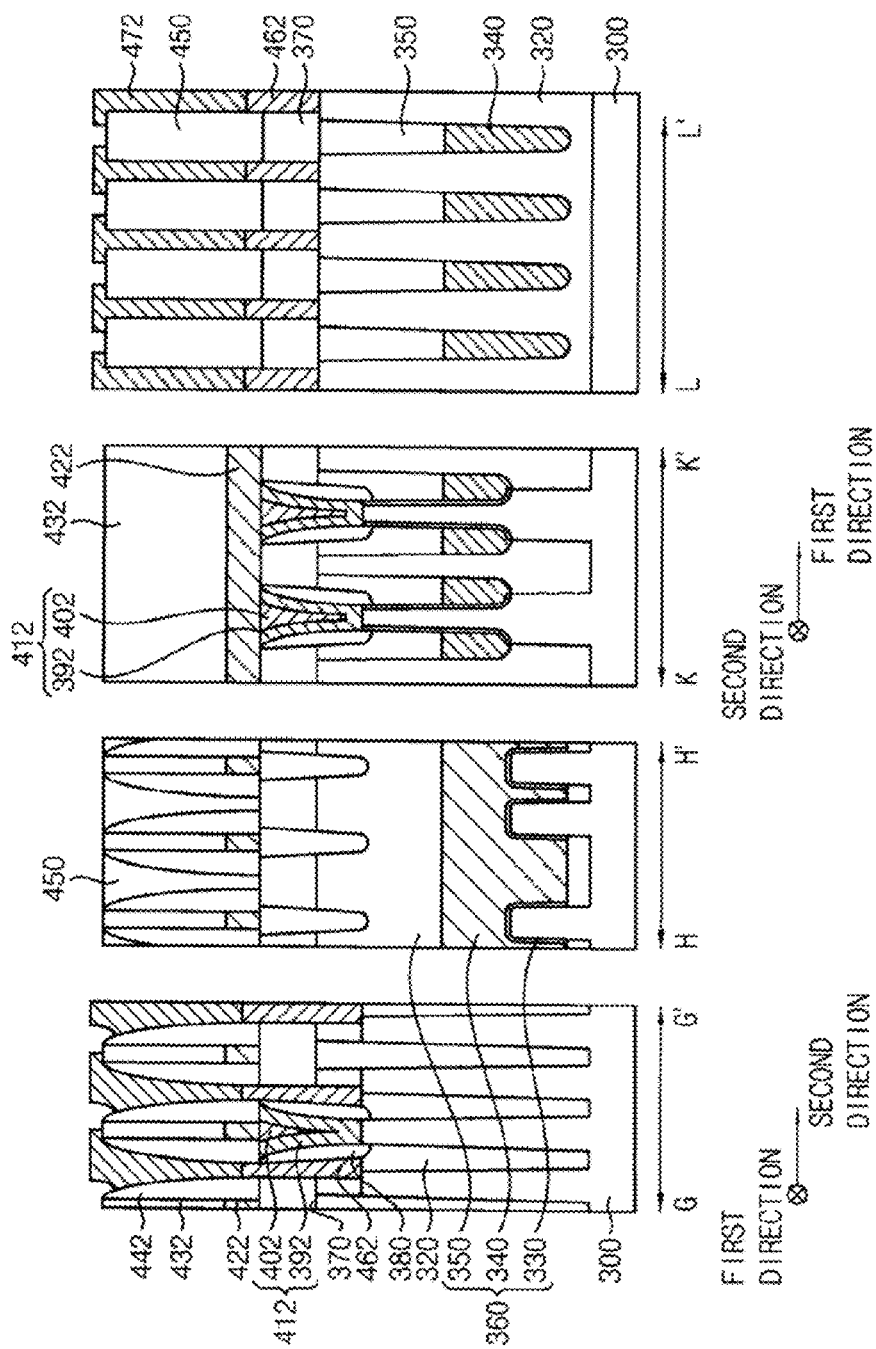

Referring to FIGS. 32 and 33, landing pads 472 may be formed to contact top surfaces of the second contact plugs 462 respectively.

A second conductive layer may be formed on the second contact plugs 462, the bit line structures and the second insulating interlayer 450 to sufficiently fill remaining portions of the second contact holes 455, and then, the second conductive layer may be patterned to form the landing pads 472. Lower portions of the landing pads 472 may contact upper portions of the second contact plugs 462 respectively. The second conductive layer may be formed to include a metal, e.g., tungsten, aluminum, copper, etc.

In example embodiments, the second conductive layer may be patterned by performing a double patterning technology (DPT) process twice using a first photoresist pattern extending in a straight line in a fourth direction and a second photoresist pattern extending in a straight line in a fifth direction, to form the landing pads 472. For example, the fourth direction may be substantially parallel to the first direction, and the fifth direction may be neither parallel nor perpendicular to the first and second directions.

Referring to FIGS. 34 to 36, an overlay between the bit line 422 (lower pattern) and the land pad 472 (upper pattern) may be measured using the overlay measuring method described with reference to FIGS. 1 to 4.

As illustrated in FIG. 34, a high voltage electron beam having an acceleration voltage of at least 10 kV may be irradiated on a multi-layered structure in FIG. 32 to obtain a SEM image 40 of the active region and the bit line. The SEM image 40 may include an image of the bit line (lower pattern) LP2 and an image of the landing pad (upper pattern) HP3.

Further, a desired gray level range of the SEM image may be selected to divide the SEM image 40 into a first image representing the bit line 422 in a lower layer and a second image representing the landing pad 472 in an upper layer. Then, a representative position of the bit line in the first image and a representative position of the landing pad in the second image may be calculated. For example, based on edge information of the pattern, a position center for the bit line may be calculated in the first image and a position center for the landing pad may be calculated in the second image.

The bit line active region may have a one-dimensional linear shape extending in the first direction and the landing pad may have a two-dimensional pad shape. The position center for the bit line may have one-dimensional position information and the position center for the landing pad may have two-dimensional position information.

As illustrated in FIG. 35, a reference position for each bit line LD2 and a reference position for each landing pad HD3 may be determined from a design image 45 of the bit lines and the landing pads. In example embodiments, a lattice point P2 may be determined as the reference position for each the bit line LD2 and for each the landing pad HD3 in the design image 45 of the bit lines and the landing pads. The lattice point may be one common lattice for the active region and the first contact hole. That is, the lattice point P2 at one vertex of the landing pad may be determined as the reference point for the actual bit line pattern and the actual landing pad pattern.

Then, after a position deviation ($\vec{R}_{iB}$) of the lower pattern (bit line) in the first image with respect to the reference position P2 and a position deviation ($\vec{R}_{iA}$) of the upper pattern (landing pad) in the second image with respect to the reference position P2 are calculated, the position deviations may be compared to determine the overlay between the upper pattern and the lower pattern.

Referring again to FIG. 35, the landing pads 472 in FIG. 32 may be formed by performing a double pattering technology (DPT) process twice using first and second photoresist patterns in different directions, and the landing pads of the design image may be sorted into first landing pads HD3_1, second landing pads HD3_2 and third landing pads HD3_3. After an overlay of the first landing pads HD3_1 and an overlay of the second landing pads HD3_2 are measured, the overlay measurements may be compared with each other to determine an overlay between the first to third landing pads HD3_1, HD3_2 and HD3_3 formed in the same layer.

Figure 37:
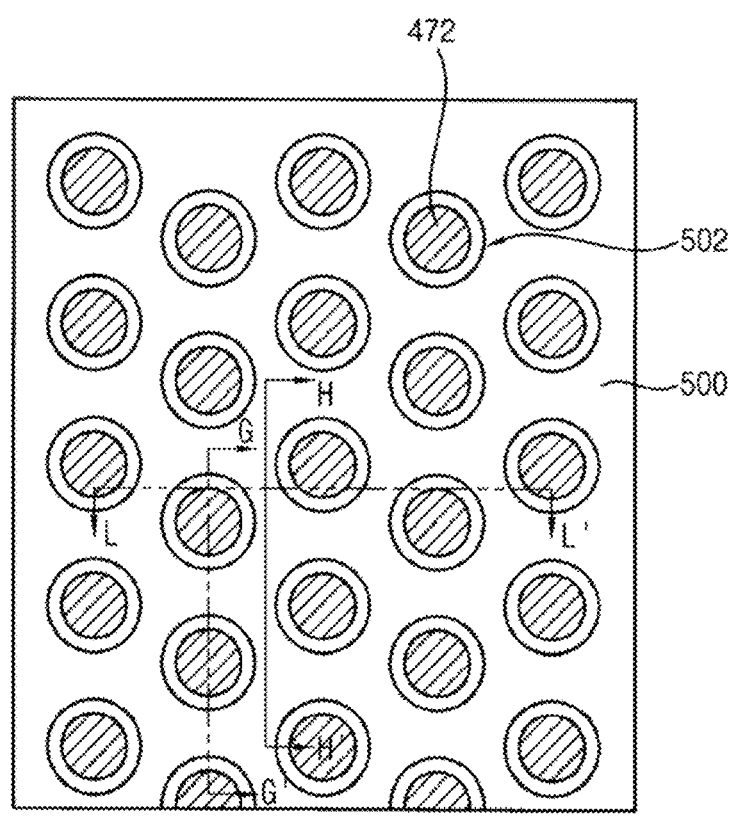
Figure 38:
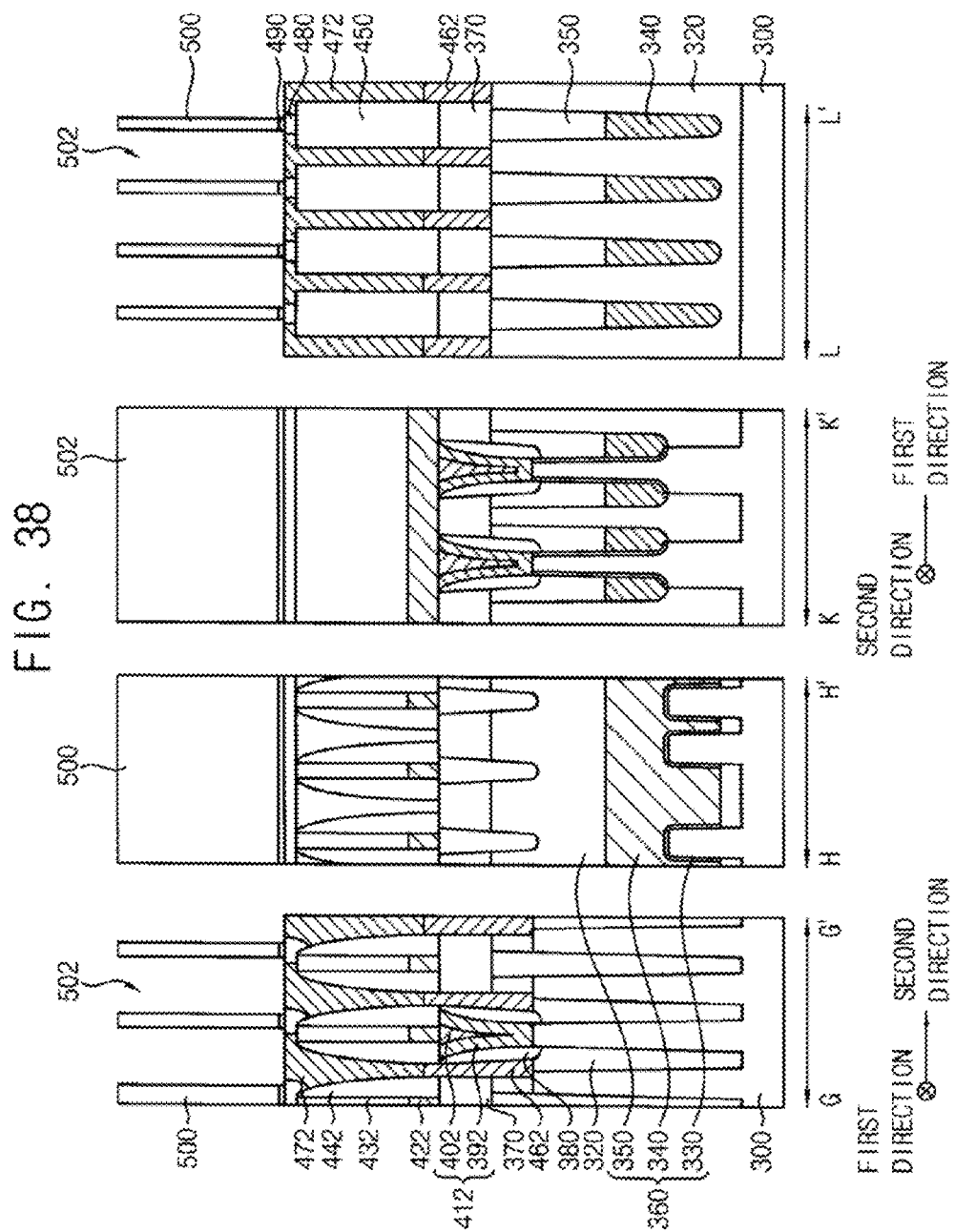

Referring to FIGS. 37 and 38, in order to form a lower electrode of a capacitor, a third insulating interlayer 480 and a mold layer 500 are formed on the landing pads 472, and then, third contact holes 502 may be formed in the mold layer to expose top surfaces of the landing pads 472 respectively.

After the third insulating interlayer 480 is formed on the bit line structures and the second insulating interlayer 450 to cover the landing pads 472, an upper portion of the third insulating interlayer 480 may be planarized until the top surface of the landing pads 472 may be exposed. An etch stop layer 490 and the mold layer 500 may be sequentially formed on the third insulating interlayer 480 and the landing pads 472, and may be partially etched to form the third contact holes 502 exposing top surfaces of the landing pads 472, respectively. In the etching process, a top surface of the third insulating interlayer 480 may be also partially exposed. In example embodiments, the third contact holes may form a honeycomb structure. That is, the third contact holes may be formed at positions corresponding to vertices and centers of hexagons when viewed from a top side.

In example embodiments, the mold layer may be patterned by performing a double patterning technology process twice using a third photoresist pattern (not illustrated) extending in a straight line in a sixth direction and a fourth photoresist pattern (not illustrated) extending in a straight line in a seventh direction, to form the third contact holes 502. For example, the sixth direction may be substantially parallel to the first direction, and the seventh direction may be neither parallel nor perpendicular to the first and second directions.

Referring to FIGS. 39 to 41, an overlay between the landing pad 472 (lower pattern) and the third contact hole 502 (upper pattern) may be measured using the overlay measuring method described with reference to FIGS. 1 to 4.

As illustrated in FIG. 39, a high voltage electron beam having an acceleration voltage of at least 10 kV may be irradiated on a multi-layered structure in FIG. 37 to obtain a SEM image 50 of the landing pad and the third contact hole. The SEM image 50 may include an image of the landing pad (lower pattern) LP3 and an image of the third contact hole (upper pattern) HP4.

Further, a desired gray level range of the SEM image may be selected to divide the SEM image 50 into a first image representing the landing pad 472 in a lower layer and a second image representing the third contact hole 502 in an upper layer. Then, a representative position of the landing pad in the first image and a representative position of the third contact hole in the second image may be calculated. For example, based on edge information of the pattern, a position center for the landing pad may be calculated in the first image and a position center for the third contact hole may be calculated in the second image.

As illustrated in FIG. 40, a reference position for each landing pad LD3 and a reference position for each third contact hole HD4 may be determined from a design image 55 of the bit lines and the landing pads.

As illustrated in FIG. 41, a lattice point P2 may be determined as the reference position for each the landing pad LD3 and for each the third contact hole HD4 in the design image 58 of the landing pads and the third contact holes. The lattice point may be one common lattice for the landing pad and the third contact hole. That is, the lattice point P2 at one vertex of the third contact hole may be determined as the reference point for the actual landing pad pattern and the actual third contact hole pattern. Here, the third contact hole HD4 of the design image 58 may correspond to one vertex of an overlapped region of the third photoresist pattern HD4_A and the fourth photoresist pattern HD4_B.

Then, after a position deviation ($\vec{R}_{iB}$) of the lower pattern (landing pad) in the first image with respect to the reference position P2 and a position deviation ($\vec{R}_{iA}$) of the upper pattern (third contact hole) in the second image with respect to the reference position P2 are calculated, the position deviations may be compared to determine the overlay between the upper pattern and the lower pattern.

Referring to FIG. 42, capacitors 540 contacting the landing pads 472, respectively, may be formed in the semiconductor device.

After a lower electrode layer is formed on sidewalls of the third contact holes 502, the exposed top surfaces of the landing pads 472, the exposed top surface of the third insulating interlayer 480 and the mold layer, a sacrificial layer (not shown) may be formed on the lower electrode layer to sufficiently fill remaining portions of the third contact holes, and upper portions of the sacrificial layer and the lower electrode layer may be planarized until a top surface of the mold layer is exposed to divide the lower electrode layer into a plurality of pieces. The sacrificial layer and the mold layer may be removed. Thus, a plurality of cylindrical lower electrodes 510 may be formed on the sidewalls of the third contact holes, the exposed top surfaces of the landing pads 472, the exposed top surface of the third insulating interlayer 480, and the lower electrodes 510 may form a honeycomb structure in accordance with the honeycomb structure of the third contact holes. In another implementation, a plurality of pillar-shaped lower electrodes may be formed instead of the plurality of cylindrical lower electrodes 510, and in this case, the lower electrode layer may entirely fill the third contact holes and the sacrificial layer may not be formed. Hereinafter, only the case in which the cylindrical lower electrodes 510 are formed will be illustrated.

A dielectric layer 520 may be formed on the lower electrodes 510 and the etch stop layer 490, and an upper electrode 530 may be formed on the dielectric layer 520 to form the capacitors 540 each of which may include the lower electrode 510, the dielectric layer 520 and the upper electrode 530. The lower and upper electrodes 510 and 530 may be formed to include doped polysilicon, a metal, a metal nitride, etc., and the dielectric layer 520 may be formed to include a metal oxide, silicon oxide, etc.

Embodiments may be applied to a method of manufacturing various types of semiconductor devices including upper and lower pattern structures, e.g., pads, contact holes, masks, wirings, etc. For example, embodiments may be applied to a method of manufacturing a semiconductor device such as the above-mentioned DRAM device as well as FLASH or logic device.

What is claimed is:

1. A method of manufacturing a semiconductor device, the method comprising:
    preparing a multi-layered structure of an upper pattern and a lower pattern, the lower pattern being formed by a first semiconductor process, the upper pattern being formed by a second semiconductor process;
    irradiating an electron beam onto the multi-layered structure to obtain an actual image of the upper and lower patterns;
    obtaining a first image representing the upper pattern and a second image representing the lower pattern from the actual image;
    matching each of the first and second images and a design image of the first and second patterns to determine an overlay between the upper pattern and the lower pattern; and
    compensating at least one of the first and second semiconductor processes based on the overlay measurement.

2. The method as claimed in claim 1, wherein obtaining the actual image comprises detecting secondary electrons emitting from an upper layer in which the upper pattern is formed and detecting backscattered electrons emitting from a lower layer in which the lower pattern is formed.

3. The method as claimed in claim 1, wherein obtaining the first image and the second image from the actual image comprises dividing the actual image according to a gray level distribution into the first image and the second image.

4. The method as claimed in claim 1, wherein matching each of the first and second images and the design image comprises
    calculating a position center for the upper pattern in the first image;
    calculating a position center for the lower pattern in the second image;
    determining a reference position for the upper and lower patterns from the design image; and
    calculating a position deviation of the upper pattern with respect to the reference position in the first image and a position deviation of the lower pattern with respect to the reference position in the second image.

5. The method as claimed in claim 4, wherein determining the reference position for the upper and lower patterns from the design image comprises determining a lattice point corresponding to each of the upper and lower patterns from the design image.

6. The method as claimed in claim 5, wherein the lattice point is a common lattice which is determined from the design image of any one of the upper and lower patterns.

7. The method as claimed in claim 5, wherein the position deviation of the upper pattern is a relative position of the upper pattern with respect to the corresponding lattice point and the position deviation of the lower pattern is a relative position of the lower pattern with respect to the corresponding lattice point.

8. The method as claimed in claim 4, wherein calculating the position deviation of the upper pattern and the position deviation of the lower pattern comprises
    sorting the upper patterns in a same layer or the lower patterns in a same layer into at least two first and second groups of patterns; and
    calculating position deviations of the first and second groups of the patterns to determine an overlay between the first and second groups of the patterns.

9. The method as claimed in claim 1, wherein the upper and lower patterns comprise one-dimensional or two-dimensional structure.

10. The method as claimed in claim 1, wherein compensating the at least one of the first and second semiconductor processes comprises, when any one of the processes is determined to be in an abnormal process state, compensating a process parameter of the process.

* * * * *